(12) United States Patent
Tabata et al.

(10) Patent No.: US 12,532,683 B2
(45) Date of Patent: *Jan. 20, 2026

(54) APPARATUS FOR SUBSTRATE PROCESSING

(71) Applicant: Tokyo Electron Limited, Tokyo (JP)

(72) Inventors: Masahiro Tabata, Miyagi (JP); Toru Hisamatsu, Miyagi (JP); Sho Kumakura, Miyagi (JP); Ryuichi Asako, Miyagi (JP); Shinya Ishikawa, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 625 days.

This patent is subject to a terminal disclaimer.

(21) Appl. No.: 17/820,670

(22) Filed: Aug. 18, 2022

(65) Prior Publication Data
US 2023/0010069 A1    Jan. 12, 2023

Related U.S. Application Data

(63) Continuation of application No. 16/999,145, filed on Aug. 21, 2020, now Pat. No. 11,488,836, which is a
(Continued)

(30) Foreign Application Priority Data

Dec. 25, 2017   (JP) ................... 2017-247342
Oct. 17, 2018   (JP) ................... 2018-195950

(51) Int. Cl.
| | |
|---|---|
| *H01J 37/32* | (2006.01) |
| *G03F 7/40* | (2006.01) |
| *H01L 21/02* | (2006.01) |
| *H01L 21/3065* | (2006.01) |
| *H01L 21/308* | (2006.01) |

(Continued)

(52) U.S. Cl.
CPC .......... *H01L 21/32139* (2013.01); *G03F 7/40* (2013.01); *H01J 37/3244* (2013.01);
(Continued)

(58) Field of Classification Search
CPC ......... H01L 21/32139; H01L 21/02118; H01L 21/02164; H01L 21/0228; H01L 21/3065;
(Continued)

(56) References Cited

U.S. PATENT DOCUMENTS 5,064,520 A * 11/1991 Miyake ............... C23C 14/3414
                                                            204/192.12
7,192,531 B1    3/2007 Kang et al.
(Continued)

FOREIGN PATENT DOCUMENTS

| | | |
|---|---|---|
| JP | H02-033153 A | 2/1990 |
| JP | 2004-080033 A | 3/2004 |

(Continued)

*Primary Examiner* — Rudy Zervigon
(74) *Attorney, Agent, or Firm* — XSENSUS LLP

(57) ABSTRACT

A method of processing a substrate is provided. The substrate includes an etching target region and a patterned region. The patterned region is provided on the etching target region. In the method, an organic film is formed on a surface of the substrate. Subsequently, the etching target region is etched by plasma generated from a processing gas. The organic film is formed in a state that the substrate is placed in a processing space within a chamber. When the organic film is formed, a first gas containing a first organic compound is supplied toward the substrate, and then, a second gas containing a second organic compound is supplied toward the substrate. An organic compound constituting the organic film is generated by polymerization of the first organic compound and the second organic compound.

22 Claims, 22 Drawing Sheets

Related U.S. Application Data continuation of application No. 16/229,036, filed on Dec. 21, 2018, now Pat. No. 10,777,425.

(51) Int. Cl.
*H01L 21/311* (2006.01)
*H01L 21/3213* (2006.01)
*H01L 21/768* (2006.01)

(52) U.S. Cl.
CPC .. *H01L 21/02118* (2013.01); *H01L 21/02164* (2013.01); *H01L 21/0228* (2013.01); *H01L 21/3065* (2013.01); *H01L 21/3083* (2013.01); *H01L 21/31116* (2013.01); *H01L 21/31138* (2013.01); *H01L 21/31144* (2013.01); *H01L 21/768* (2013.01)

(58) Field of Classification Search
CPC .......... H01L 21/3083; H01L 21/31116; H01L 21/31138; H01L 21/31144; H01L 21/768; H01L 21/0274; H01L 21/324; H01L 21/67069; H01L 21/67098; H01L 21/6831; G03F 7/40; H01J 37/3244; C09K 13/00
USPC ....... 118/663, 665, 688; 156/345.24, 345.25, 156/345.26, 345.27, 345.28; 216/67
See application file for complete search history.

(56) References Cited

U.S. PATENT DOCUMENTS

| | | | |
|---|---|---|---|
| 7,622,394 B2 | 11/2009 | Ikegami | |
| 2002/0126261 A1* | 9/2002 | Nomura | G09F 9/372 353/31 |
| 2003/0235993 A1 | 12/2003 | Leung et al. | |
| 2005/0074651 A1* | 4/2005 | Kidai | H01M 8/0289 429/492 |
| 2006/0062914 A1 | 3/2006 | Garg et al. | |
| 2006/0134917 A1* | 6/2006 | Huang | H01L 21/0338 257/E21.038 |
| 2009/0017259 A1 | 1/2009 | Nakagawa et al. | |
| 2010/0068885 A1* | 3/2010 | Cirigliano | H01L 21/31144 257/E21.249 |
| 2011/0244443 A1* | 10/2011 | van Rijn | B01D 67/0034 435/283.1 |
| 2012/0247502 A1 | 10/2012 | Moriya et al. | |
| 2013/0235120 A1* | 9/2013 | Hirabayashi | B41J 2/1606 347/45 |
| 2013/0256268 A1* | 10/2013 | Chen | H01J 37/32504 156/345.24 |
| 2014/0096909 A1* | 4/2014 | Singh | H01J 37/32724 156/345.52 |
| 2015/0270140 A1* | 9/2015 | Gupta | H01L 21/32136 216/67 |
| 2016/0372308 A1* | 12/2016 | Murakami | H01J 37/3244 |
| 2017/0103901 A1 | 4/2017 | Shen et al. | |
| 2017/0229316 A1 | 8/2017 | Surla et al. | |
| 2017/0350004 A1 | 12/2017 | Kaufman-Osborn et al. | |
| 2017/0352533 A1 | 12/2017 | Tois et al. | |
| 2018/0301716 A1 | 10/2018 | Choi et al. | |

FOREIGN PATENT DOCUMENTS

| | | |
|---|---|---|
| JP | 2010-532917 A | 10/2010 |
| JP | 2017-073535 A | 4/2017 |
| WO | 2009/002892 A1 | 12/2008 |

* cited by examiner

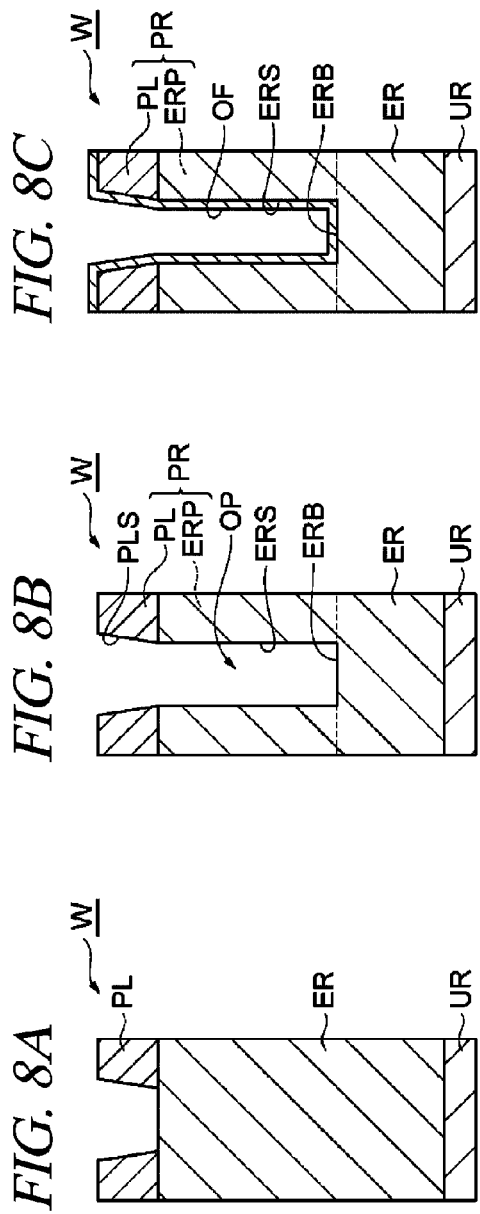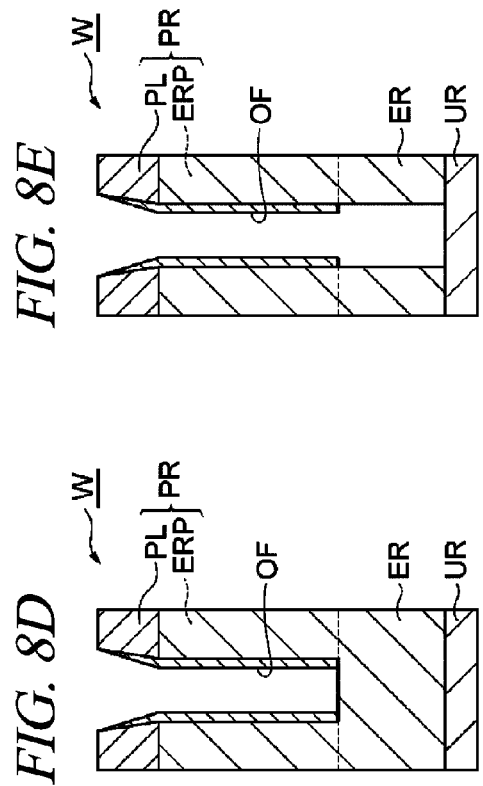

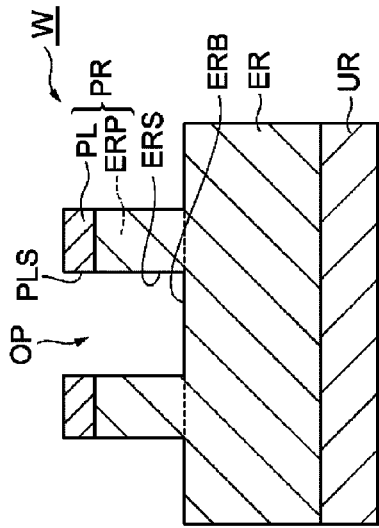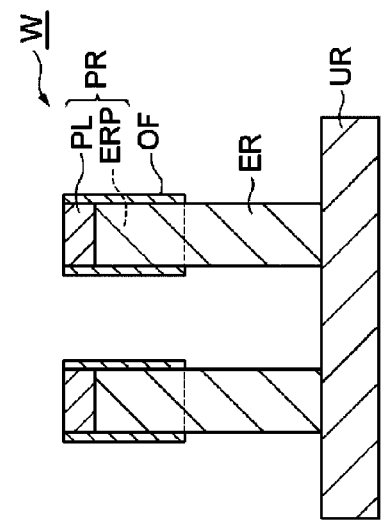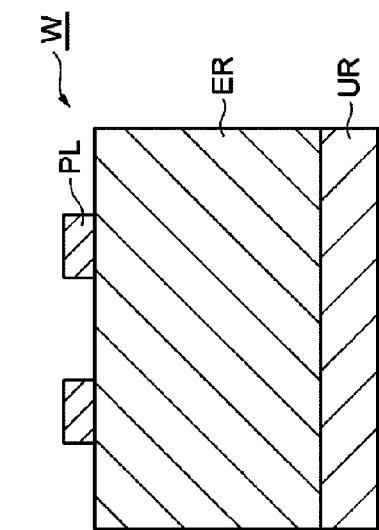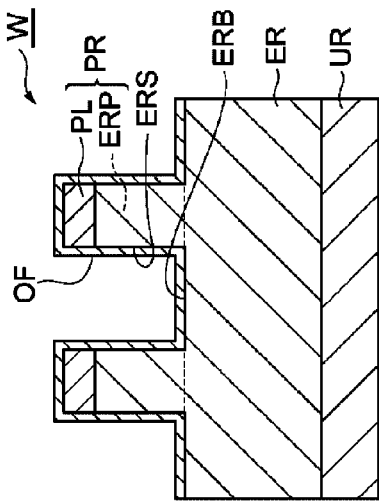

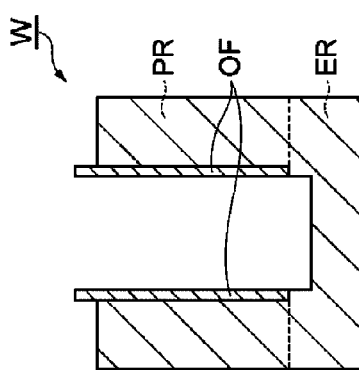
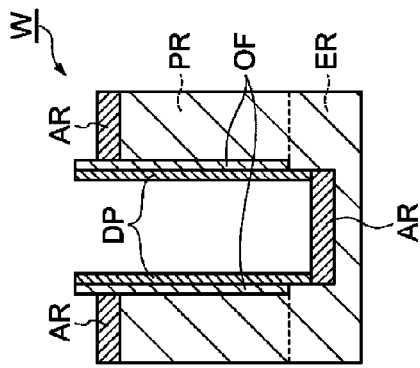
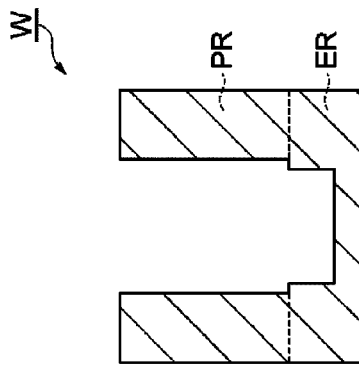

APPARATUS FOR SUBSTRATE PROCESSING

CROSS-REFERENCE TO RELATED APPLICATION

This is a continuation application of U.S. patent application Ser. No. 16/999,145, filed on Aug. 21, 2020, which is a continuation of U.S. patent application Ser. No. 16/229,036, filed on Dec. 21, 2018, now issued as U.S. Pat. No. 10,777,425, which claims the benefit of Japanese Patent Application Nos. 2017-247342 and 2018-195950 filed on Dec. 25, 2017, and Oct. 17, 2018, respectively, the entire disclosures of which are incorporated herein by reference.

TECHNICAL FIELD

The various aspects and embodiments described herein pertain generally to a method of processing a substrate.

BACKGROUND

In the manufacture of an electronic device, a substrate processing including plasma etching is performed to process an etching target region of a substrate. A kind of the substrate processing includes film formation and plasma etching. Such a substrate processing is described in Patent Document 1.

A substrate to which the substrate processing of Patent Document 1 is applied includes an etching target region and a mask. The mask is provided with an opening and is provided on the etching target region. The mask is a resist mask. In the substrate processing of Patent Document 1, a silicon oxide film is formed on a surface of the substrate. The silicon oxide film is formed by the film formation through atomic layer deposition. In this substrate processing, a width of the opening of the mask is adjusted by the silicon oxide film. Then, the etching target region is etched by using plasma.

Patent Document 1: Japanese Patent Laid-open Publication No. 2004-080033

As such a substrate processing including the film formation and the plasma etching, it may be considered to perform the plasma etching after forming a silicon oxide film on a surface of a substrate to protect a side surface of an opening formed in an etching target region. In this substrate processing as well as the substrate processing disclosed in Patent Document 1, an oxygen gas needs to be used to form the silicon oxide film. The oxygen gas reacts with carbon in the resist mask to cause deformation of the resist mask. Further, the oxygen gas is capable of oxidizing the etching target region. That is, the oxygen gas may inflict an undesirable damage on the substrate including the patterned region and the etching target region. Thus, in the substrate processing including the film formation and the plasma etching, it is required to suppress the damage of the substrate.

Further, in case that the etching target region is made of silicon oxide, the aforementioned silicon oxide film is removed along with the etching target region when the plasma etching is performed. Thus, if the etching target region is formed of the silicon oxide in the substrate processing including the film formation and the plasma etching, it is required to form, through the film formation, a film which can suppress, when the etching target region is plasma-etched, the etching.

SUMMARY

In one exemplary embodiment, there is provided a method of processing a substrate. The substrate includes an etching target region and a patterned region. The patterned region is provided on the etching target region. The method includes (i) forming an organic film on a surface of the substrate; and (ii) etching the etching target region by using plasma generated from a processing gas after performing the forming of the organic film. The forming of the organic film is performed in a state that the substrate is placed in a processing space within a chamber. The forming of the organic film comprises (iii) supplying a first gas containing a first organic compound toward the substrate; and (iv) supplying a second gas containing a second organic compound toward the substrate. In the forming of the organic film, an organic compound constituting the organic film is generated by polymerization of the first organic compound and the second organic compound, and the supplying of the first gas and the supplying of the second gas are alternately repeated.

In the method according to the exemplary embodiment, the film formation on the surface of the substrate is accomplished by the polymerization of the first organic compound and the second organic compound. In this method, an oxygen gas is not used for the film formation on the surface of the substrate. Thus, according to this method, in the substrate processing including the film formation and the plasma etching, a damage on the substrate due to the oxygen gas is suppressed. Further, the film formed by this method is the organic film. Thus, according to this method, in case that the etching target region is made of silicon oxide, when the etching target region is plasma-etched, the film capable of suppressing the etching is formed on the substrate.

In another exemplary embodiment, there is provided a method of processing a substrate. The substrate includes a patterned region and an etching target region. The etching target region is surrounded by a side surface of the patterned region. The method includes forming an organic film on a surface of the substrate; etching the organic film extended on the etching target region such that a portion of the organic film along the side surface of the patterned region is left; and etching the etching target region by using plasma generated from a processing gas after performing the etching of the organic film. The forming of the organic film is performed in a state that the substrate is placed in a processing space within a chamber. The forming of the organic film comprises supplying a first gas containing a first organic compound toward the substrate; and supplying a second gas containing a second organic compound toward the substrate. In the forming of the organic film, an organic compound constituting the organic film is generated by polymerization of the first organic compound and the second organic compound, and the supplying of the first gas and the supplying of the second gas are alternately repeated.

The polymerization of the first organic compound and the second organic compound takes place at a temperature equal to or larger than 30° C. and equal to or smaller than 200° C.

The supplying of the first gas and the supplying of the second gas are performed in a state that the patterned region is heated.

An electrostatic chuck configured to hold the substrate is provided within the chamber, and a heater is provided within the electrostatic chuck. In the supplying of the first gas and the supplying of the second gas, the patterned region is heated by the heater provided within the electrostatic chuck.

A sequence including the supplying of the first gas and the supplying of the second gas is performed a preset number of times. According to this exemplary embodiment, a thickness of the organic film is determined depending on a repetition number of the sequence.

The patterned region is made of an organic material, a metal-containing material or a silicon-containing material. The etching target region is made of a silicon-containing material.

The processing gas includes a fluorocarbon gas, a hydrofluorocarbon gas, a HBr gas or a $Cl_2$ gas.

The first organic compound is isocyanate, and the second organic compound is amine.

The first organic compound is isocyanate, and the second organic compound is a compound having a hydroxyl group.

The first organic compound is carboxylic acid, and the second organic compound is amine.

The first organic compound is carboxylic halide, and the second organic compound is amine.

The first organic compound is carboxylic acid, and the second organic compound is a compound having a hydroxyl group.

The first organic compound is carboxylic halide, and the second organic compound is a compound having a hydroxyl group.

The first organic compound is carboxylic anhydride, and the second organic compound is amine.

As stated above, in the substrate processing including the film formation and the plasma etching, it is possible to suppress the damage on the substrate. Further, in the substrate processing including the film formation and the plasma etching, in case that the etching target region is made of the silicon oxide, it is possible to form, through the film formation, the film capable of suppressing the etching when the etching target film is etched.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A is a partially enlarged cross sectional view illustrating still yet another example substrate to which the method MT is applicable, FIG. 8B is a partially enlarged cross sectional view illustrating a state of this still yet another example substrate after a process STa is performed, FIG. 8C is a partially enlarged cross sectional view illustrating a state of this still yet another example substrate after the process ST1 is performed, FIG. 8D is a partially enlarged cross sectional view illustrating a state of this still yet another example substrate after a process STb is performed, and FIG. 8E is a partially enlarged cross sectional view illustrating a state of this still yet another example substrate after the process ST2 is performed;

FIG. 9A is a partially enlarged cross sectional view illustrating still yet another example substrate to which the method MT is applicable, FIG. 9B is a partially enlarged cross sectional view illustrating a state of this still yet another example substrate after the process STa is performed, FIG. 9C is a partially enlarged cross sectional view illustrating a state of this still yet another example substrate after the process ST1 is performed, and FIG. 9D is a partially enlarged cross sectional view illustrating a state of this still yet another example substrate after the process ST2 is performed;

FIG. 17A is a partially enlarged cross sectional view illustrating still yet another example substrate after a process ST29 of FIG. 16 is performed, FIG. 17B is a partially enlarged cross sectional view illustrating a state of this still yet another example substrate after a process ST26 and a process ST27 of FIG. 16 are performed, and FIG. 17C is a partially enlarged cross sectional view illustrating a state of this still yet another example substrate after a process ST28 of FIG. 16 is performed;

DETAILED DESCRIPTION

Figure 1:
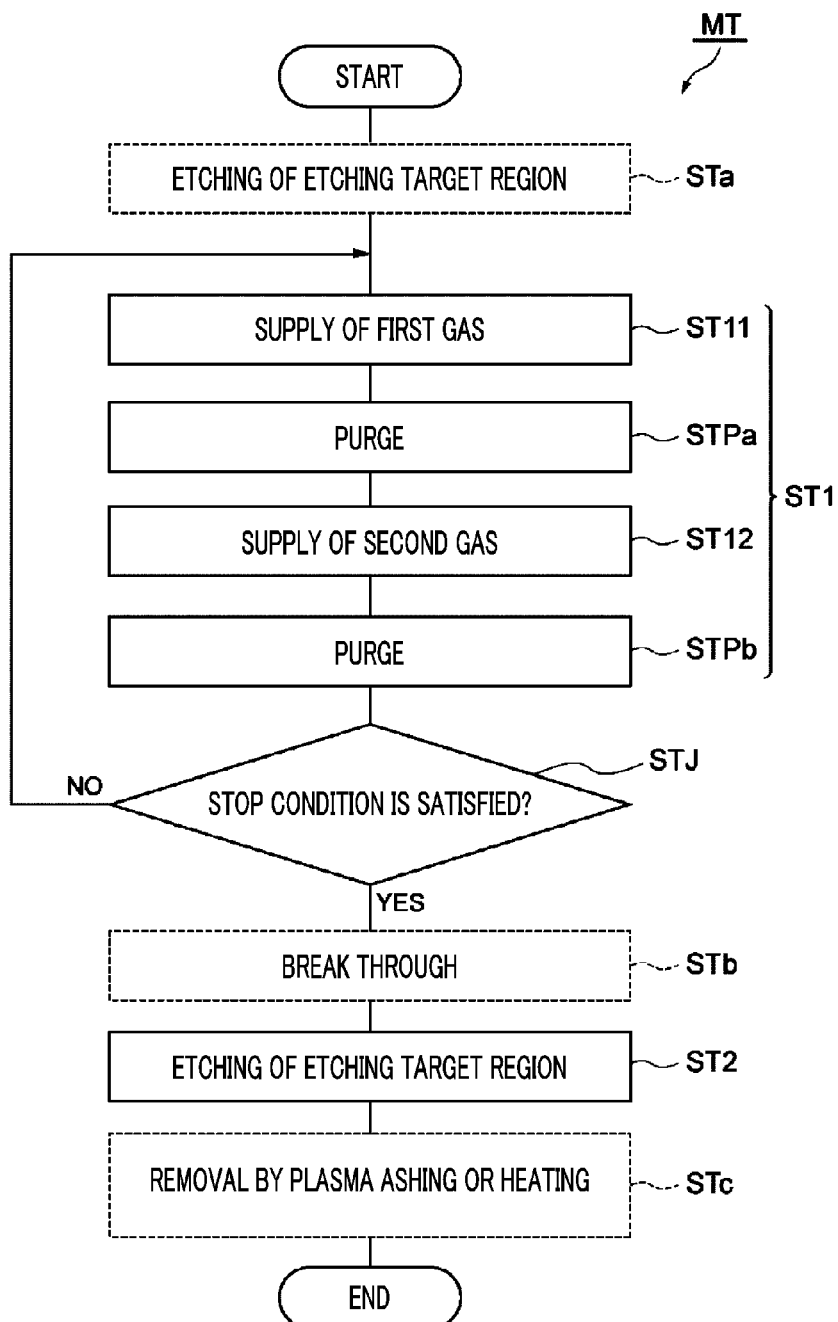
FIG. 1 is a flowchart illustrating a method of processing a substrate according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
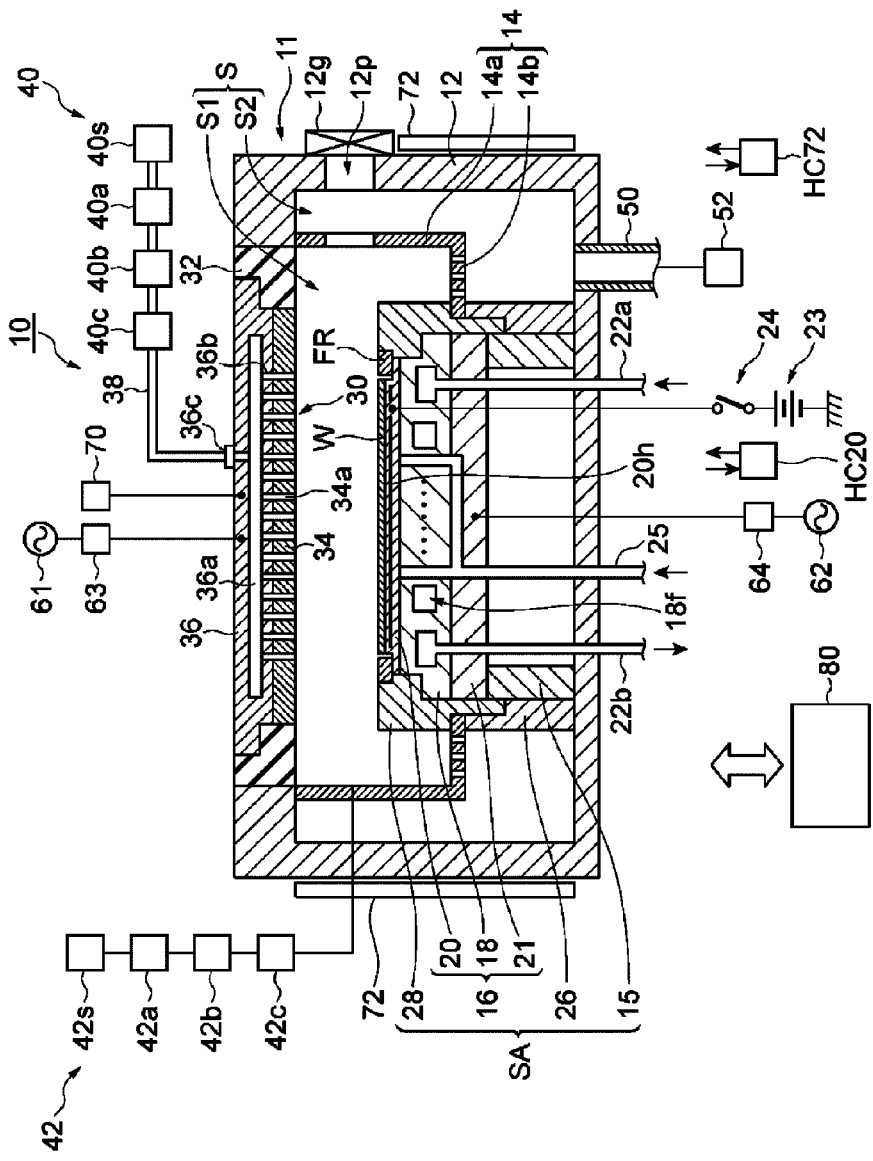
FIG. 2 is a diagram schematically illustrating an example of a plasma processing apparatus which can be used in a method MT shown in FIG. 1.

FIG. 1 is a flowchart illustrating a substrate processing method according to an exemplary embodiment. The substrate processing method (hereinafter, referred to as "method MT") shown in FIG. 1 includes film formation of a process ST1 and plasma etching of a process ST2. In the exemplary embodiment, the method MT is performed in a plasma processing apparatus. FIG. 2 is a diagram schematically illustrating an example of the plasma processing apparatus which can be used in the method MT shown in FIG. 1. A plasma processing apparatus 10 shown in FIG. 2 is configured as a capacitively coupled plasma processing apparatus.

The plasma processing apparatus 10 includes a chamber 11. The chamber 11 has an internal space S. The internal space S includes a first space S1 and a second space S2. The chamber 11 includes a chamber main body 12. The chamber main body 12 has a substantially cylindrical shape. The internal space S is provided in the chamber main body 12. The chamber main body 12 is made of, by way of example, aluminum. The chamber main body 12 is connected to a ground potential. A film having corrosion resistance is formed on an inner wall surface of the chamber main body 12, that is, on a surface of the chamber main body 12 forming and confining the internal space S. This film may be a film formed by anodic oxidation or a film made of ceramic such as yttrium oxide.

Further, a passage 12p is formed at a sidewall of the chamber main body 12. When the substrate W is transferred between the internal space S (first space S1) and an outside of the chamber main body 12, the substrate W passes through the passage 12p. This passage 12p can be opened or closed by a gate valve 12g. The gate valve 12g is provided along the sidewall of the chamber main body 12.

A partition wall 14 is provided in the internal space S. The partition wall 14 is extended on the boundary between the first space S1 and a second space S2. The partition wall 14 is provided with multiple through holes to allow the first space S1 and the second space S2 to communicate with each other. The partition wall 14 may be prepared by forming a corrosion-resistant film on a surface of a base member made of a material such as aluminum. The corrosion-resistant film may be a film formed by anodic oxidation or a film made of ceramic such as yttrium oxide.

In the present exemplary embodiment, the partition wall 14 includes a shield member 14a and a baffle plate 14b. The shield member 14a has a substantially cylindrical shape. The shield member 14a is extended in a vertical direction along the sidewall of the chamber main body 12 in the inner space S. The shield member 14a is spaced apart from the sidewall of the chamber main body 12. An upper end of the shield member 14a is extended up to an upper end of the chamber 11 to be fixed thereat. In the plasma processing apparatus 10, a substrate processing is performed in the first space S1 which is a processing space. In the substrate processing, a by-product such as a reaction product is generated. The amount of the by-product adhering to the surface of the chamber main body 12 is reduced by the shield member 14a.

The baffle plate 14b is extended in a direction intersecting the shield member 14a. The baffle plate 14b is extended between the shield member 14a and a supporting table to be described later. The multiple through holes of the partition wall 14 are formed at this baffle plate 14b. The shield member 14a and the baffle plate 14b may be formed as one body or may be provided separately from each other.

In the internal space S, a supporting member 15 is extended upwards from a bottom portion of the chamber main body 12. The supporting member 15 has a substantially cylindrical shape and is made of an insulating material such as quartz. A supporting table 16 is mounted on the supporting member 15. The supporting table 16 is supported by the supporting member 15. The supporting table 16 is configured to support the substrate W in the first space S1. The supporting table 16 includes a lower electrode 18 and an electrostatic chuck 20. The supporting table 16 may further include an electrode plate 21. The electrode plate 21 is made of a conductive material such as aluminum and has a substantially disk shape. The lower electrode 18 is provided on the electrode plate 21. The lower electrode 18 is made of a conductive material such as aluminum and has a substantially disk shape. The lower electrode 18 is electrically connected with the electrode plate 21.

A path 18f is formed within the lower electrode 18. The path 18f is a passage for a heat exchange medium. By way of non-limiting example, a liquid coolant or a coolant (e.g., freon) which cools the lower electrode 18 by vaporization thereof may be used as the heat exchange medium. The heat exchange medium is supplied into the path 18f via a pipeline 22a from a chiller unit provided at an outside of the chamber main body 12. The heat exchange medium supplied into the path 18f is returned back into the chiller unit via a pipeline 22b. That is, the heat exchange medium is supplied to be circulated between the path 18l and the chiller unit.

The electrostatic chuck 20 is provided on the lower electrode 18. The electrostatic chuck 20 includes a main body and an electrode. The main body of the electrostatic chuck 20 is made of a dielectric material and has a substantially disk shape. The electrode of the electrostatic chuck 20 is a film-shaped electrode and provided within the main body of the electrostatic chuck 20. The electrode of the electrostatic chuck 20 is electrically connected with a DC power supply 23 via a switch 24. If a voltage is applied from the DC power supply 23 to the electrode of the electrostatic chuck 20, an electrostatic attracting force is generated between the electrostatic chuck 20 and the substrate W placed thereon. The substrate W is attracted to the electrostatic chuck 20 by the generated electrostatic attracting force to be held by the electrostatic chuck 20.

The plasma processing apparatus 10 is provided with a gas supply line 25. A heat transfer gas such as a He gas from a gas supply device is suppled to a gap between a top surface of the electrostatic chuck 20 and a rear surface (bottom surface) of the substrate W through the gas supply line 25.

One or more heaters 20h (for example, a resistance heating element) may be provided within the electrostatic chuck 20. A power is fed to the one or more heaters 20h from a heater controller HC20. In a configuration in which multiple heaters 20h are provided within the electrostatic chuck 20, temperatures of multiple regions of the electrostatic chuck 20 are individually adjusted by adjusting powers applied to the multiple heaters 20h from the heater controller HC20, and, thus, it is possible to adjust a temperature distribution within a surface of the electrostatic chuck 20 (that is, within a surface of the substrate W).

A focus ring FR is disposed on a peripheral region of the electrostatic chuck 20. The focus ring FR has a substantially circular plate shape. The focus ring FR is made of a silicon-containing material such as silicon, quartz or silicon carbide. The focus ring FR is configured to surround an edge of the substrate W.

A cylindrical member 26 is extended upwards from the bottom portion of the chamber main body 12. The cylindrical member 26 is extended along an outer side surface of the supporting member 15. The cylindrical member 26 is made of a conductive material and has a substantially cylindrical shape. The cylindrical member 26 is connected to the ground potential. A surface of the cylindrical member 26 may be made of a corrosion-resistant film. The corrosion-resistant film may be a film formed by anodic oxidation or a film made of ceramic such as yttrium oxide.

An insulating member 28 is provided on the cylindrical member 26. The insulating member 28 has insulation property and is made of ceramic such as quartz. The insulating member 28 has a substantially cylindrical shape and is extended along outer side surfaces of the electrode plate 21, the lower electrode 18 and the electrostatic chuck 20. Further, a peripheral portion of the aforementioned baffle plate 14b is located between the cylindrical member 26 and the insulating member 28 to be sandwiched between the cylindrical member 26 and the insulating member 28.

The supporting member 15, the supporting table 16, the cylindrical member 26 and the insulating member 28 constitute a supporting assembly SA. The supporting assembly SA is extended across the first space S1 and the second space S2.

The plasma processing apparatus 10 further includes an upper electrode 30. The upper electrode 30 is provided above the supporting table 16. The upper electrode 30 closes a top opening of the chamber main body 12 along with a member 32. The member 32 has insulation property. The upper electrode 30 is supported at an upper portion of the chamber main body 12 with this member 32 therebetween.

The upper electrode 30 includes a ceiling plate 34 and a supporting body 36. A bottom surface of the ceiling plate 34 forms and confines the internal space S (or the first space S1). The ceiling plate 34 is provided with multiple gas discharge holes 34a. These gas discharge holes 34a are formed through the ceiling plate 34 in a plate thickness direction thereof (vertical direction). This ceiling plate 34 is made of, by way of example, but not limitation, silicon. Alternatively, the ceiling plate 34 may have a structure in which a corrosion-resistant film is provided on a surface of a base member made of aluminum. This film may be a film formed by anodic oxidation or a film formed of ceramic such as yttrium oxide.

The supporting body 36 is a component configured to support the ceiling plate 34 in a detachable manner. The supporting body 36 may be made of a conductive material such as, but not limited to, aluminum. A gas diffusion space 36a is provided within the supporting body 36. Multiple gas holes 36b are extended downwards from the gas diffusion space 36a. The multiple gas holes 36b respectively communicate with the multiple gas discharge holes 34a. The supporting body 36 is provided with a gas inlet port 36c which is connected to the gas diffusion space 36a, and a gas supply line 38 is connected to this gas inlet port 36c.

The gas supply line 38 is connected to a gas supply unit 40. The gas supply unit 40 is equipped with a gas source group 40s, a valve group 40a, a flow rate controller group 40*b* and a valve group 40*c*. The gas source group 40*s* includes a plurality of gas sources. The plurality of gas sources belonging to the gas source group 40*s* include sources of a plurality of gases used in the method MT. Further, the plurality of gas sources belonging to the gas source group 40*s* include a source of a first gas to be described later. Further, the plurality of gas sources belonging to the gas source group 40*s* may include a source of a second gas to be described later, not the source of the first gas.

Each of the valve group 40*a* and the valve group 40*c* includes a plurality of valves. The flow rate controller group 40*b* includes a plurality of flow rate controllers. Each of the flow rate controllers belonging to the flow rate controller group 40*b* may be a mass flow controller or a pressure control type flow rate controller. Each of the plurality of gas sources belonging to the gas source group 40*s* is connected to the gas supply line 38 via a corresponding valve belonging to the valve group 40*a*, a corresponding flow rate controller belonging to the flow rate controller group 40*b* and a corresponding valve belonging to the valve group 40*c*. The gas from the gas supply unit 40 is supplied into the first space S1 via the gas supply line 38, the gas diffusion space 36*a*, the multiple gas holes 36*b* and the multiple gas discharge holes 34*a*.

The plasma processing apparatus 10 further includes a gas supply unit 42. The gas supply unit 42 includes a gas source 42*s*, a valve 42*a*, a flow rate controller 42*b* and a valve 42*c*. The gas source 42*s* is the source of the second gas. Further, in case that the gas supply unit 40 includes the source of the second gas, not the source of the first gas, the gas source 42*s* may be the source of the first gas. The flow rate controller 42*b* may be a mass flow controller or a pressure control type flow rate controller. The gas source 42*s* is connected to the first space S1 via the valve 42*a*, the flow rate controller 42*b* and the valve 42*c*. The gas from the gas supply unit 42 is supplied into the first space S1.

A gas exhaust line 50 is connected to the bottom portion of the chamber main body 12 of the plasma processing apparatus 10. The gas exhaust line 50 is connected to a gas exhaust device 52. The gas exhaust device 52 is connected to the second space S2 via the gas exhaust line 50. Further, the gas exhaust device 52 is connected to the first space S1 via the second space S2 and the multiple through holes of the partition wall 14. The gas exhaust device 52 includes a pressure control valve and a decompression pump. The decompression pump is connected to the second space S2 via the pressure control valve. The decompression pump may be a turbo molecular pump and or a dry pump.

The plasma processing apparatus 10 is capable of generating, in the first space S1, plasma from a gas supplied into the first space S1. The plasma processing apparatus 10 further includes a first radio frequency power supply 61. The first radio frequency power supply 61 is configured to generate a first radio frequency power for plasma generation. The first radio frequency power has a frequency ranging from, for example, 27 MHz to 100 MHz. The first radio frequency power supply 61 is connected to the upper electrode 30 via a matching device 63. The matching device 63 is equipped with a matching circuit configured to match an output impedance of the first radio frequency power supply 61 and an impedance at a load side (upper electrode 30 side). Further, the first radio frequency power supply 61 may be connected to the lower electrode 18 via the matching device 63. In this case, the upper electrode 30 is electrically grounded.

The plasma processing apparatus 10 may further include a second radio frequency power supply 62. The second radio frequency power supply 62 is configured to generate a second radio frequency bias power for attraction of ions into the substrate W. A frequency of the second radio frequency power is lower than the frequency of the first radio frequency power. The frequency of the second radio frequency power may be in the range from, for example, 400 kHz to 13.56 MHz. The second radio frequency power supply 62 is connected to the lower electrode 18 via a matching device 64. The matching device 64 is equipped with a matching circuit configured to match an output impedance of the second radio frequency power supply 62 and an impedance at a load side (lower electrode 18 side).

In the plasma processing apparatus 10, if the first radio frequency power is supplied in a state that the gas is supplied in the first space S1, the gas is excited and the plasma is generated in the first space S1 (processing space). Further, if the second radio frequency power is supplied to the lower electrode 18, ions in the plasma are accelerated toward the substrate W.

The plasma processing apparatus 10 is further equipped with a DC power supply 70. The DC power supply 70 is connected to the upper electrode 30. The DC power supply 70 is configured to apply a negative DC voltage to the upper electrode 30. If the negative DC voltage is applied to the upper electrode 30, positive ions in the plasma generated in the first space S1 collide with the ceiling plate 34 of the upper electrode 30. If the positive ions collide with the ceiling plate 34, secondary electrons are released from the ceiling plate 34. In case that the ceiling plate 34 is made of silicon, if the positive ions collide with the ceiling plate 34, the silicon may be released from the ceiling plate 34.

The plasma processing apparatus 10 is further equipped with a heater 72. A power from a heater controller HC72 is fed to the heater 72. If the power is fed to the heater 72 from the heater controller HC72, the heater 72 generates heat for heating an object within the internal space S and the chamber main body 12.

In the exemplary embodiment, the plasma processing apparatus 10 may be further equipped with a control unit 80. The control unit 80 is configured to control individual components of the plasma processing apparatus 10. The control unit 80 may be implemented by a computer including a processor, a storage device such as a memory, an input device, a display device, and so forth. The control unit 80 executes control programs stored in the storage device and controls the individual components of the plasma processing apparatus 10 based on recipe data stored in the storage device. As a result, the plasma processing apparatus 10 performs a process designated by the recipe data. By way of example, the control unit 80 controls the individual components of the plasma processing apparatus 10 in performing the method MT.

Figure 3A:
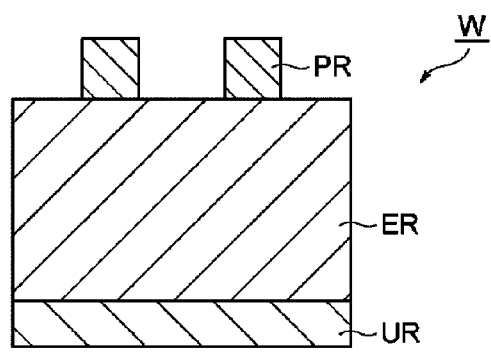
FIG. 3A is a partially enlarged cross sectional view of an example substrate to which the method MT is applicable.
Figure 3B:
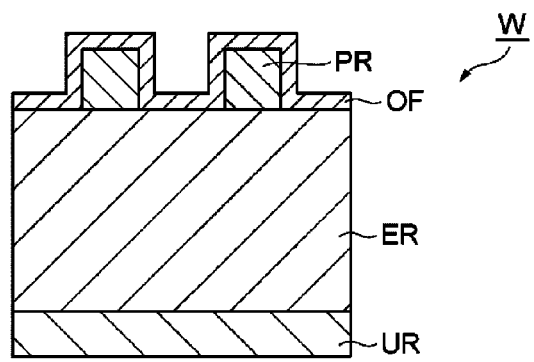
FIG. 3B is a partially enlarged cross sectional view illustrating a state of the example substrate after a process ST1 is performed.

Referring back to FIG. 1, the method MT will be described. In the following, the method MT will be explained for an example case where the method MT is performed by using the plasma processing apparatus 10. Further, in the following description, reference is made to FIG. 3A, FIG. 3B and FIG. 3C as well as FIG. 1. FIG. 3A is a partially enlarged cross sectional view of an example substrate to which the method MT is applicable; FIG. 3B, a partially enlarged cross sectional view illustrating a state of the example substrate after a process ST1 is performed; and FIG. 3C, a partially enlarged cross sectional view illustrating a state of the example substrate after a process ST2 is performed.

As depicted in FIG. 3A, the example substrate W includes an underlying region UR, an etching target region (hereinafter, referred to as "region ER") and a patterned region (hereinafter, referred to as "region PR"). The region ER is a region to be etched in the method MT and is formed to have a layer shape. The region ER is provided on the underlying layer UR. The region ER may be made of, by way of example, but not limitation, a silicon-containing material. The region PR is provided on the region ER. The region PR is patterned. The region PR is a layer patterned to provide, for example, an opening. The region PR is made of an organic material, a silicon-containing material or a metal-containing material (e.g., titanium-containing material or tungsten-containing material). Further, in case that the region PR is made of the silicon-containing material, the region ER may be made of another silicon-containing material. By way of example, if the region PR is made of silicon nitride, the region ER is made of silicon oxide.

The process ST1 in the method MT is performed in a state that the substrate W is placed in the first space S1, that is, the processing space. Within the processing space, the substrate W is placed on the supporting table 16 (on the electrostatic chuck 20). In the process ST1, an organic film OF is formed on a surface of the substrate W, as shown in FIG. 3B.

The process ST1 includes a process ST11 and a process ST12. The process ST1 may further include a process STPa and a process STPb. In the process ST11, the first gas is supplied toward the substrate W. In the process ST11 according to the exemplary embodiment, the first gas is supplied into the processing space (first space S1) from either one of the gas supply unit 40 and the gas supply unit 42. The first gas includes a first organic compound. As the process ST11 is performed, the first organic compound is adsorbed into the substrate W or a previously formed organic film.

The process STPa is performed between the process ST11 and the process ST12. In the process STPa, the processing space is purged. That is, the gas within the processing space is exhausted. Further, in the process STPa, an inert gas such as a nitrogen gas or a rare gas may be supplied into the processing space from the gas supply unit 40. As the process STPa is performed, the first organic compound excessively deposited on the substrate W is removed.

In the process ST12, the second gas is supplied toward the substrate W. In the process ST12 according to the exemplary embodiment, the second gas is supplied into the processing space (first space S1) from the other of the gas supply unit 40 and the gas supply unit 42. The second gas includes a second organic compound. In the process ST1, an organic compound constituting the organic film OF is generated by polymerization of the first organic compound and the second organic compound.

The process STPb is performed after the process ST12. In the process STPb, the processing space is purged. That is, the gas within the processing space is exhausted. Further, in the process STPb, an inert gas such as a nitrogen gas or a rare gas may be supplied into the processing space from the gas supply unit 40. As the process STPb is performed, the second organic compound excessively deposited on the substrate W is removed.

In the exemplary embodiment, the polymerization of the first organic compound and the second organic compound takes place at a temperature equal to or larger than 30° C. and equal to or smaller than 200° C. While the process ST1 (the process ST11 and the process ST12) of the exemplary embodiment is being performed, the region PR is heated such that the polymerization of the first organic compound and the second organic compound takes place. The region PR is heated by a heating device which is not particularly limited. While the process ST1 (the process ST11 and the process ST12) of the exemplary embodiment is being performed, the substrate W is heated by the one or more heaters 20h within the electrostatic chuck 20. While the process ST1 is being performed, the gas exhaust device 52 is controlled such that a pressure within the processing space is set to be a designated pressure.

In the process ST1, the process ST11 and the process ST12 are repeated alternately. In the exemplary embodiment, a sequence including the process ST11 and the process ST12 is performed a preset number of times. A thickness of the organic film OF relies on this preset number of times. In a process STJ, it is determined whether a stop condition is satisfied. The stop conditions is found to be satisfied when a repetition number of the sequence reaches the preset number of times. If it is determined in the process STJ that the stop condition is not satisfied, the sequence is performed again. Meanwhile, if it is determined in the process STJ that the stop condition is met, the process ST1 is ended. Further, in the process ST1, the sequence may be performed only one time. Furthermore, each sequence of the process ST1 may not include at least one of the process STPa or the process STPb. Moreover, in each sequence of the process ST1, the process ST12 may be performed prior to the process ST11.

As a result of performing the process ST1, the organic film OF is formed on the surface of the substrate W, as illustrated in FIG. 3B. A width of the opening of the region PR is adjusted by this organic film OF.

In the method MT, the process ST2 is subsequently performed. According to the exemplary embodiment, the process ST2 is performed in the state that the substrate W is placed in the first space S1, that is, in the processing space. In the process ST2, plasma etching of the region ER is performed. In the process ST2, a processing gas is supplied into the processing space (first space S1). In case that the region ER is made of silicon oxide, the processing gas may contain a fluorocarbon gas (e.g., a $C_4F_6$ gas), and may further contain a rare gas and an oxygen gas. The processing gas may contain a hydrofluorocarbon gas in addition to or instead of the fluorocarbon gas. In the process ST2, the gas exhaust device 52 is controlled such that the pressure within the processing space is set to a designated pressure. Further, in the process ST2, the first radio frequency power is supplied to excite the processing gas. In the process ST2, the second radio frequency power is supplied to the lower electrode 18.

Figure 3C:
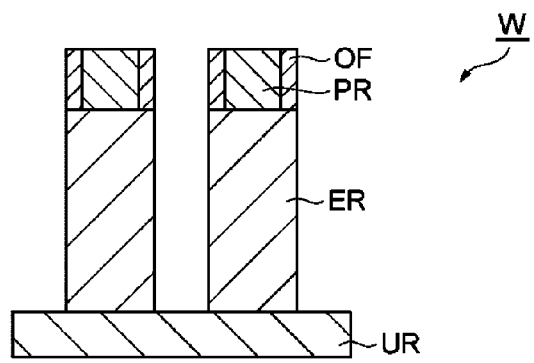
FIG. 3C is a partially enlarged cross sectional view illustrating a state of the example substrate after a process ST2 is performed.

In the process ST2, the processing gas is excited within the processing space, so that plasma from the processing gas is generated. In the process ST2, the region ER is etched by active species such as ions and radicals from the plasma of the processing gas. As a result, as depicted in FIG. 3C, a portion of the region ER exposed from a region including the region PR and the organic film OF is removed.

In the present exemplary embodiment, the method MT may further include a process STb. The process STb is performed between the process ST1 and the process ST2. In the process STb, the organic film OF extended on the portion of the region ER to be etched is removed. In the process STb, a processing gas containing, by way of example, a nitrogen gas ($N_2$ gas) and a hydrogen gas ($H_2$ gas) is supplied into the processing space (first space S1). In the process STb, the gas exhaust device 52 is controlled to set the pressure within the processing space to a preset pressure. Furthermore, in the process STb, the first radio frequency power is supplied to excite the processing gas. In the process STb, the second radio frequency power is supplied to the lower electrode 18.

As a result of performing this process STb, the organic film OF extended on the portion of the region ER to be etched is removed, so that the region ER is exposed.

In the method MT, the film formation on the surface of the substrate W is accomplished by the polymerization of the first organic compound and the second organic compound. In the method MT, an oxygen gas is not used in the film formation on the surface of the substrate W. Thus, according to the method MT, in the substrate processing including the film formation and the plasma etching, a damage on the substrate due to the oxygen gas is avoided. By way of example, if the patterned region PR is made of an organic material, a damage on this region PR due to the oxygen gas is suppressed. Further, if the region ER contains silicon, oxidation of the region ER is suppressed.

Moreover, the film formed in the method MT is the organic film OF. Accordingly, in case that the region ER is made of silicon oxide, when the region ER is plasma-etched, the film capable of suppressing the etching is formed on the substrate W. As a result, when the organic film OF has a function of adjusting the width of the opening of the region PR, this function is maintained throughout the plasma etching of the process ST2.

Further, in the process ST1 according to the exemplary embodiment, a sequence including the process ST11, the process STPa, the process ST12 and the process STPb is performed multiple times. In the present exemplary embodiment, the organic film OF is formed in the same manner as the film formation by the atomic layer deposition method. Accordingly, the organic film OF can be conformally formed on the surface of the substrate W.

Now, examples of the first organic compound, the second organic compound and the organic compound generated by the polymerization of the first organic compound and the second organic compound, that is, the organic compound constituting the organic film OF will be described.

The first organic compound may be isocyanate represented by the following chemical formula (1) or (2), and the second organic compound may be amine represented by the following chemical formula (3) or (4). That is, the first organic compound may be monofunctional isocyanate or difunctional isocyanate, and the second organic compound may be monofunctional amine or difunctional amine.

[Chemical formula (1)]

$$OCN-R \tag{1}$$

[Chemical formula (2)]

$$OCN-R-NCO \tag{2}$$

[Chemical formula (3)]

$$N_2N-R \tag{3}$$

[Chemical formula (4)]

$$H_2N-R-NH_2 \tag{4}$$

In the chemical formulas (1) and (2), R denotes a saturated hydrocarbon group such as an alkyl group (straight chain alkyl group or cyclic alkyl group), an unsaturated hydrocarbon group such as an aryl group or a group including a hetero atom such as N, O, S, F or Si. The group including the hetero atom includes an unsaturated hydrocarbon group or a saturated hydrocarbon group a part of elements of which is substituted with N, O, S, F or Si. As the isocyanate as the first organic compound, an aliphatic compound or an aromatic compound may be used, for example. As the aliphatic compound, an aliphatic chain compound or an aliphatic cyclic compound may be used. The aliphatic compound may be, for example, hexamethylene diisocyanate. Further, the aliphatic cyclic compound may be, by way of non-limiting example, 1,3-bis(isocyanate methyl)cyclohexane (H6XDI).

In the chemical formulas (3) and (4), R denotes a saturated hydrocarbon group such as an alkyl group (straight chain alkyl group or cyclic alkyl group), an unsaturated hydrocarbon group such as an aryl group or a group including a hetero atom such as N, O, S, F or Si. The group including the hetero atom includes an unsaturated hydrocarbon group or a saturated hydrocarbon group a part of elements of which is substituted with N, O, S, F or Si. Further, an atomic group denoted by R in the chemical formulas (1) and (2) may be the same as or different from an atomic group denoted by R in the chemical formulas (3) and (4). As an example of the amine as the second organic compound, an aliphatic compound or an aromatic compound may be used. As the aliphatic compound, an aliphatic chain compound or an aliphatic cyclic compound may be used. The aliphatic compound may be, by way of non-limiting example, 1,12-diaminododecane (DAD). The aliphatic cyclic compound may be, by way of non-limiting example, 1,3-bis(amino methyl)cyclohexane (H6XDA). Further, the amine as the second organic compound may be secondary amine.

An organic compound generated by polymerization (addition condensation) of the isocyanate and the amine may be a compound having an urea bond represented by the following chemical formulas (5) to (8). A compound represented by the chemical formula (5) is generated by polymerization of the compound expressed by the chemical formula (1) and the compound expressed by the chemical formula (3). A compound represented by the chemical formula (6) is generated by polymerization of the compound expressed by the chemical formula (1) and the compound expressed by the chemical formula (4). Alternatively, the compound represented by the chemical formula (6) is generated by polymerization of the compound expressed by the chemical formula (2) and the compound expressed by the chemical formula (3). A compound represented by the chemical formula (7) is generated by polymerization of the compound expressed by the chemical formula (2) and the compound expressed by the chemical formula (4). A compound represented by the chemical formula (8) has a structure in which both ends of the polymer expressed by the chemical formula (7) are terminated with a monomer having an isocyanate group (for example, the compound expressed by the chemical formula (1)) and a monomer having an amino group (for example, the compound expressed by the chemical formula (3)), respectively. Further, in the chemical formulas (7) and (8), n denotes an integer equal to or larger than 2.

[Chemical formula (5)]

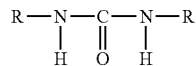

(5)

[Chemical formula (6)]

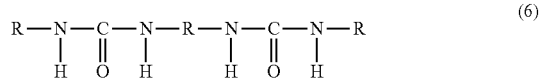

(6)

[Chemical formula (7)]

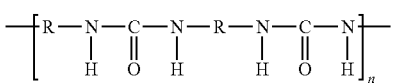
(7)

[Chemical formula (8)]

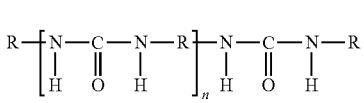
(8)

As another example, the first organic compound may be isocyanate expressed by the chemical formula (1) or (2), and the second organic compound may be a compound having a hydroxyl group expressed by the following chemical formula (9) or (10). That is, the first organic compound may be monofunctional isocyanate or difunctional isocyanate, and the second organic compound may be a monofunctional compound having a hydroxyl group or a difunctional compound having a hydroxyl group.

[Chemical formula (9)]

HO—R        (9)

[Chemical formula (10)]

HO—R—OH        (10)

In the chemical formulas (9) and (10), R denotes a saturated hydrocarbon group such as an alkyl group (straight chain alkyl group or cyclic alkyl group), an unsaturated hydrocarbon group such as an aryl group or a group including a hetero atom such as N, O, S, F or Si. The group including the hetero atom includes an unsaturated hydrocarbon group or a saturated hydrocarbon group a part of elements of which is substituted with N, O, S, F or Si. Further, the atomic group denoted by R in the chemical formulas (1) and (2) may be the same as or different from the atomic group denoted by R in the chemical formulas (9) and (10). The compound having the hydroxyl group may be alcohol or phenol. The alcohol as the second organic compound may be, by way of non-limiting example, ethylene glycol. Further, the phenol as the second organic compound may be, by way of example, but not limitation, hydroquinone.

An organic compound generated by polymerization (polyaddition) of the isocyanate and the compound having the hydroxyl group may be a compound having a urethane bond represented by the following chemical formulas (11) to (15). A compound represented by the chemical formula (11) is generated by polymerization of the compound expressed by the chemical formula (1) and the compound expressed by the chemical formula (9). A compound represented by the chemical formula (12) is generated by polymerization of the compound expressed by the chemical formula (1) and the compound expressed by the chemical formula (10). A compound represented by the chemical formula (13) is generated by polymerization of the compound expressed by the chemical formula (2) and the compound expressed by the chemical formula (9). A compound represented by the chemical formula (14) is generated by polymerization of the compound expressed by the chemical formula (2) and the compound expressed by the chemical formula (10). Further, a compound represented by the chemical formula (15) has a structure in which both ends of the polymer expressed by the chemical formula (14) are terminated with a monomer having an isocyanate group (for example, the compound expressed by the chemical formula (1)) and a monomer having a hydroxyl group (for example, the compound expressed by the chemical formula (9)), respectively. Further, in the chemical formulas (14) and (15), n denotes an integer equal to or larger than 2.

[Chemical formula (11)]

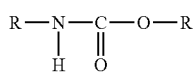
(11)

[Chemical formula (12)]

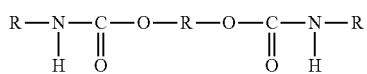
(12)

[Chemical formula (13)]

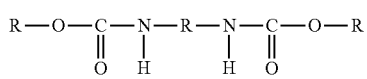
(13)

[Chemical formula (14)]

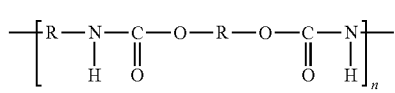
(14)

[Chemical formula (15)]

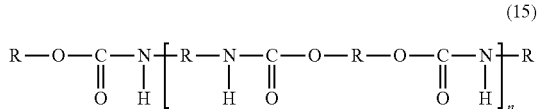
(15)

As yet another example, the first organic compound may be carboxylic acid expressed by the chemical formula (16) or (17), and the second organic compound may be amine represented by the chemical formula (3) or (4). That is, the first organic compound may be monofunctional carboxylic acid or difunctional carboxylic acid, and the second organic compound may be monofunctional amine or difunctional amine.

[Chemical formula (16)]

HOOC—R        (16)

[Chemical formula (17)]

HOOC—R—COOH        (17)

In the chemical formulas (16) and (17), R denotes a saturated hydrocarbon group such as an alkyl group (straight chain alkyl group or cyclic alkyl group), an unsaturated hydrocarbon group such as an aryl group or a group including a hetero atom such as N, O, S, F or Si. The group including the hetero atom includes an unsaturated hydrocarbon group or a saturated hydrocarbon group a part of elements of which is substituted with N, O, S, F or Si. The atomic group denoted by R in the chemical formulas (3) and (4) may be the same as or different from an atomic group denoted by R in the chemical formulas (16) and (17). The carboxylic acid as the first organic compound may be, but not limited to, terephthalic acid.

An organic compound generated by polymerization (polycondensation) of the carboxylic acid and the amine may be a compound having an amide bond represented by the following chemical formulas (18) to (22), e.g., polyamide. A compound represented by the chemical formula (18) is generated by polymerization of the compound expressed by the chemical formula (16) and the compound expressed by the chemical formula (3). A compound represented by the chemical formula (19) is generated by polymerization of the compound expressed by the chemical formula (16) and the compound expressed by the chemical formula (4). A compound represented by the chemical formula (20) is generated by polymerization of the compound expressed by the chemical formula (17) and the compound expressed by the chemical formula (3). A compound represented by the chemical formula (21) is generated by polymerization of the compound expressed by the chemical formula (17) and the compound expressed by the chemical formula (4). Further, a compound represented by the chemical formula (22) has a structure in which both ends of the polymer expressed by the chemical formula (21) are terminated with a monomer having a carboxylic group (for example, the compound expressed by the chemical formula (16)) and a monomer having an amino group (for example, the compound expressed by the chemical formula (3)), respectively. Further, in the chemical formulas (21) and (22), n denotes an integer equal to or larger than 2. In the polymerization of the carboxylic acid and the amine, a water molecule is generated. The generated water molecule is exhausted from the processing space under a decompressed environment. Thus, the polymerization of the carboxylic acid and the amine is irreversible.

[Chemical formula (18)]

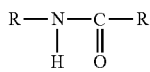

(18)

[Chemical formula (19)]

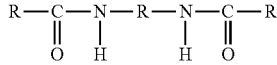

(19)

[Chemical formula (20)]

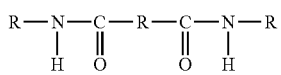

(20)

[Chemical formula (21)]

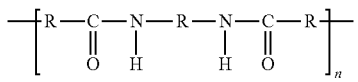

(21)

[Chemical formula (22)]

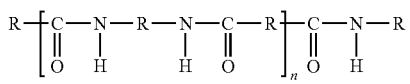

(22)

Further, the first organic compound used in the polymerization with the amine, which is represented by the chemical formula (3) or (4), may be carboxylic halide expressed by the following chemical formula (23). In the chemical formula (23), X denotes F, Cl, Br or I. Further, an atomic group denoted by R in the chemical formula (23) may be the same atomic group as the atomic group denoted by R in the chemical formulas (16) and (17).

[Chemical formula (23)]

(23)

As still yet another example, the first organic compound may be carboxylic acid expressed by the chemical formula (16) or (17), and the second organic compound may be a compound having a hydroxyl group expressed by the chemical formula (9) or (10). That is, the first organic compound may be monofunctional carboxylic acid or difunctional carboxylic acid, and the second organic compound may be a monofunctional compound having a hydroxyl group or a difunctional compound having a hydroxyl group. Further, the atomic group denoted by R in the chemical formulas (16) and (17) may be the same as or different from the atomic group represented by R in the chemical formulas (9) and (10).

An organic compound generated by polymerization (polycondensation) of the carboxylic acid and the compound having the hydroxyl group may be a compound having an ester bond represented by the following chemical formulas (24) to (28), e.g., polyester. A compound represented by the chemical formula (24) is generated by polymerization of the compound expressed by the chemical formula (16) and the compound expressed by the chemical formula (9). A compound represented by the chemical formula (25) is generated by polymerization of the compound expressed by the chemical formula (16) and the compound expressed by the chemical formula (10). A compound represented by the chemical formula (26) is generated by polymerization of the compound expressed by the chemical formula (17) and the compound expressed by the chemical formula (9). A compound represented by the chemical formula (27) is generated by polymerization of the compound expressed by the chemical formula (17) and the compound expressed by the chemical formula (10). Further, a compound represented by the chemical formula (28) has a structure in which both ends of the polymer expressed by the chemical formula (27) are terminated with a monomer having a carboxylic group (for example, the compound expressed by the chemical formula (16)) and a monomer having a hydroxyl group (for example, the compound expressed by the chemical formula (9)), respectively. Further, in the chemical formulas (27) and (28), n denotes an integer equal to or larger than 2. In the polymerization of the carboxylic acid and the compound having the hydroxyl group, a water molecule is generated. The generated water molecule is exhausted from the processing space under a decompressed environment. Thus, the polymerization of the carboxylic acid and the compound having the hydroxyl group is irreversible.

[Chemical formula (24)]

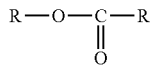

(24)

[Chemical formula (25)]

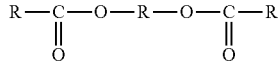

(25)

[Chemical formula (26)]

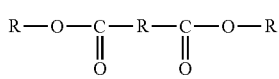
(26)

[Chemical formula (27)]

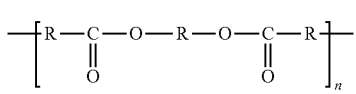
(27)

[Chemical formula (28)]

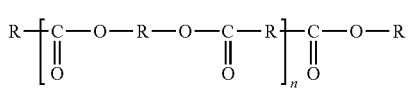
(28)

Further, the first organic compound used in the polymerization with the compound having the hydroxyl group, which is represented by the chemical formula (9) or (10), may be carboxylic halide expressed by the aforementioned chemical formula (23).

As still yet another example, the first organic compound may be carboxylic anhydride represented by the following chemical formula (29) or (30), and the second organic compound may be amine expressed by the chemical formula (3) or (4).

[Chemical formula (29)]

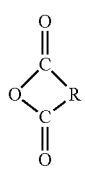
(29)

[Chemical formula (30)]

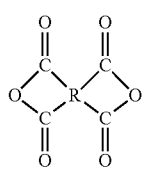
(30)

In the chemical formulas (29) and (30), R denotes a saturated hydrocarbon group such as an alkyl group (straight chain alkyl group or cyclic alkyl group), an unsaturated hydrocarbon group such as an aryl group or a group including a hetero atom such as N, O, S, F or Si. The group including the hetero atom includes an unsaturated hydrocarbon group or a saturated hydrocarbon group a part of elements of which is substituted with N, O, S, F or Si. Further, an atomic group denoted by R in the chemical formulas (29) and (30) may be the same as or different from the atomic group denoted by R in the chemical formulas (3) and (4). The carboxylic anhydride as the first organic compound may be, by way of non-limiting example, pyromellitic anhydride.

An organic compound generated by polymerization of the carboxylic anhydride and the amine may be an imide compound represented by the following chemical formula (31) or (32). A compound represented by the chemical formula (31) is generated by polymerization of the compound expressed by the chemical formula (29) and the compound expressed by the chemical formula (3). A compound represented by the chemical formula (32) is generated by polymerization of the compound expressed by the chemical formula (30) and the compound expressed by the chemical formula (4). Further, in the chemical formula (32), n denotes an integer equal to or larger than 2. A water molecule is generated in the polymerization of the carboxylic anhydride and the amine. The generated water molecule is exhausted from the processing space under a decompressed environment. Thus, the polymerization of the carboxylic anhydride and the amine is irreversible. Moreover, in the polymerization of the carboxylic anhydride and the amine, monofunctional carboxylic anhydride, difunctional carboxylic anhydride, monofunctional amine and difunctional amine may be used.

[Chemical formula (31)]

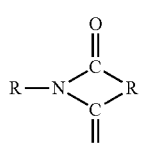
(31)

[Chemical formula (32)]

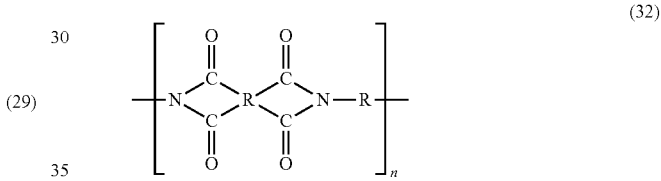
(32)

As still yet another example, the first organic compound may be bisphenol A, and the second organic compound may be diphenyl carbonate. As still yet another example, the first organic compound may be bisphenol A, and the second organic compound may be epichlorohydrin.

Figure 4A:
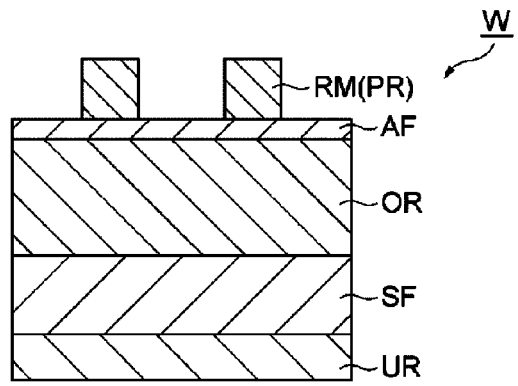
FIG. 4A is a partially enlarged cross sectional view of another example substrate to which the method MT is applicable.
Figure 4B:
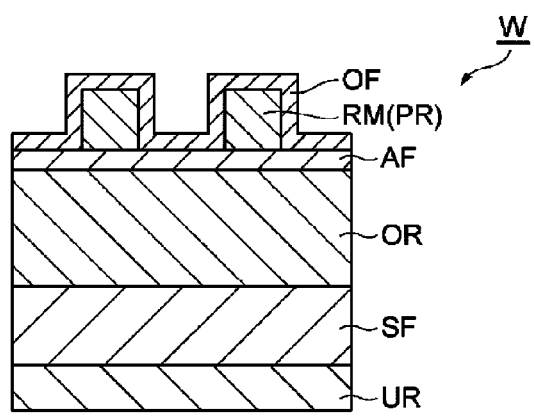
FIG. 4B is a partially enlarged cross sectional view illustrating a state of this another example substrate after the process ST1 is performed.
Figure 4C:
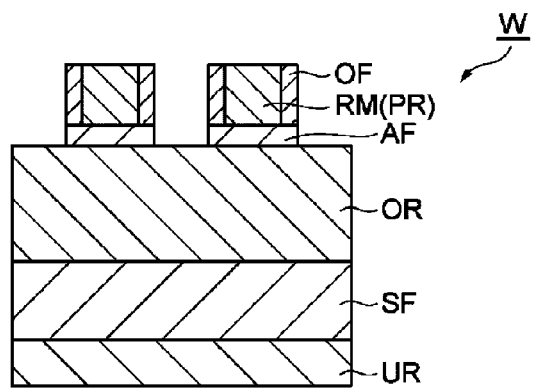
FIG. 4C is a partially enlarged cross sectional view illustrating a state of this another example substrate after the process ST2 is performed.
Figure 5A:
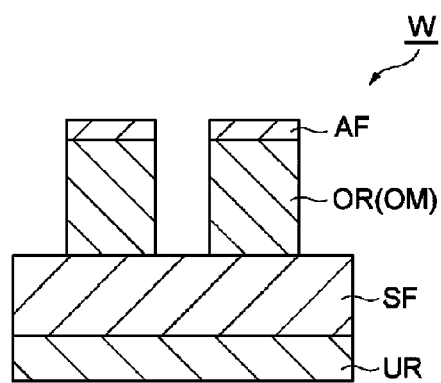
FIG. 5A is a partially enlarged cross sectional view illustrating a state of the another example substrate after an organic region is etched.
Figure 5B:
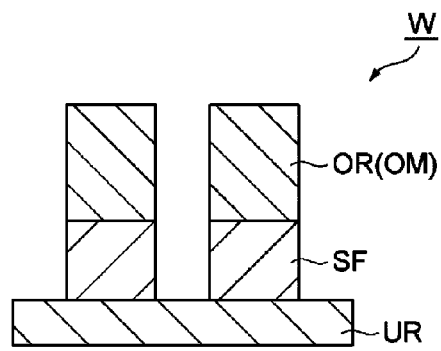
FIG. 5B is a partially enlarged cross sectional view illustrating a state of the another example substrate after a film is etched.

Now, reference is made to FIG. 4A, FIG. 4B, FIG. 4C, FIG. 5A and FIG. 5B as well as FIG. 1. FIG. 4A is a partially enlarged cross sectional view of another example substrate to which the method MT is applicable; FIG. 4B, a partially enlarged cross sectional view illustrating a state of the another example substrate after the process ST1 is performed; and FIG. 4C, a partially enlarged cross sectional view illustrating a state of the another example substrate after the process ST2 is performed. FIG. 5A is a partially enlarged cross sectional view illustrating a state of the another example substrate after an organic region is etched, and FIG. 5B is a partially enlarged cross sectional view illustrating a state of the another example substrate after a film is etched. In the exemplary embodiment, the method MT is applied to the substrate W shown in FIG. 4A. In the exemplary embodiment, the method MT is performed by using the plasma processing apparatus 10. That is, the method MT is carried out in the state that the substrate W is placed in the first space S1, that is, the processing space.

The substrate W shown in FIG. 4A includes an underlying region UR, a film SF, an organic region OR, an antireflection film AF and a mask RM. The film SF is provided on the underlying region UR. The film SF is a silicon-containing film. The film SF may be made of, by way of example, but not limitation, silicon oxide.

The organic region OR is provided on the film SF. The organic region OR is made of an organic material. The antireflection film AF is provided on the organic region OR. The antireflection film AF contains silicon. The mask RM is a resist mask and provided on the antireflection film AF. The mask RM is patterned. The mask RM is patterned to provide, for example, an opening.

In the substrate W shown in FIG. 4A, the mask RM is a patterned region, that is, a region PR, and the antireflection film AF is an etching target region, that is, a region ER. As a result of performing the process ST1 on the substrate W as a processing target, an organic film OF is formed on the substrate W, that is, on a surface of the mask RM and a surface of the antireflection film AF, as depicted in FIG. 4B.

Subsequently, the process ST2 is performed. Between the process ST1 and the process ST2, the process STb may be performed as stated above. In the process ST2, plasma etching of the antireflection film AF is performed. In the process ST2, a processing gas is supplied into the processing space (first space S1). The processing gas includes a fluorocarbon gas (e.g., a $CF_4$ gas). The processing gas may include a hydrofluorocarbon gas in addition to or instead of the fluorocarbon gas. In the process ST2, the gas exhaust device 52 is controlled such that the pressure within the processing space is set to a predetermined pressure. In the process ST2, the first radio frequency power is supplied to excite the processing gas. In the process ST2, the second radio frequency power is supplied to the lower electrode 18.

In the process ST2, the processing gas is excited within the processing space, so that plasma from the processing gas is generated. The antireflection film AF is etched by active species such as ions and radicals in the plasma from the processing gas. As a result, as shown in FIG. 4C, a portion of the antireflection film AF exposed from a region including the mask RM and the organic film OF is removed.

Subsequently, plasma etching of the organic region OR may be performed. In the process for the plasma etching of the organic region OR, a processing gas including a nitrogen gas ($N_2$ gas) and a hydrogen gas ($H_2$ gas) is supplied into the processing space (first space 51). Further, the processing gas may be an oxygen-containing gas. Further, in this process, the gas exhaust device 52 is controlled such that the pressure within the processing space is set to a predetermined pressure. Furthermore, in this process, the first radio frequency power is supplied to excite the processing gas. Further, in this process, the second radio frequency power is supplied to the lower electrode 18. In this process, the organic region OR is etched by ions and/or radicals in plasma from the processing gas. As a result, as depicted in FIG. 5A, an organic mask OM is obtained from the organic region OR.

Thereafter, plasma etching of the film SF may be performed. In case that the film SF is made of silicon oxide, a processing gas including a fluorocarbon gas is supplied into the processing space (first space 51) in a process for the plasma etching of the film SF. The processing gas may further include a rare gas and an oxygen gas. The processing gas may include a hydrofluorocarbon gas in addition to or instead of the fluorocarbon gas. Further, in this process, the gas exhaust device 52 is controlled such that the pressure within the processing space is set to a predetermined pressure. Furthermore, in this process, the first radio frequency power is supplied to excite the processing gas. Further, in this process, the second radio frequency power is supplied to the lower electrode 18. In this process, the film SF is etched by ions and/or radicals in plasma from the processing gas (see FIG. 5B).

Figure 6A:
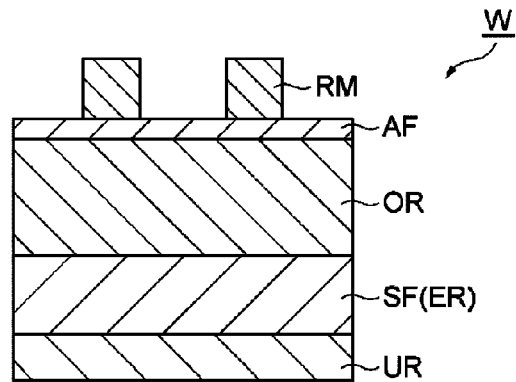
FIG. 6A is a partially enlarged cross sectional view of yet another example substrate to which the method MT is applicable.
Figure 6B:
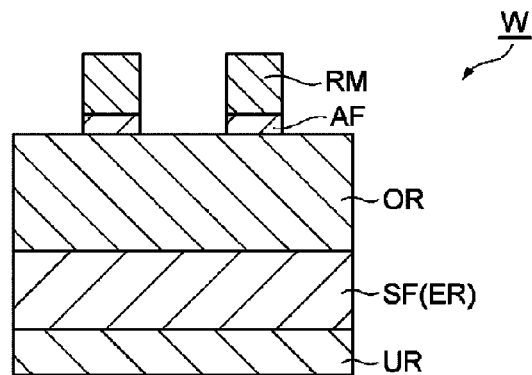
FIG. 6B is a partially enlarged cross sectional view illustrating a state of this yet another example substrate after an antireflection film is etched.
Figure 6C:
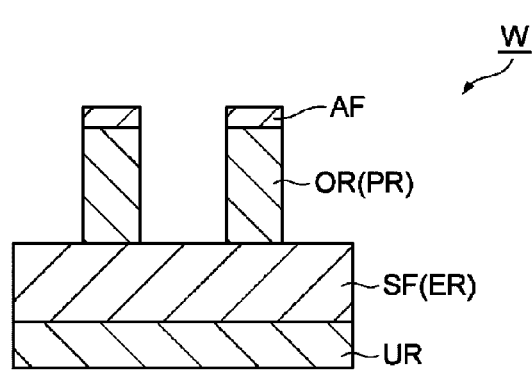
FIG. 6C is a partially enlarged cross sectional view illustrating a state of this yet another example substrate after an organic region is etched.
Figure 7A:
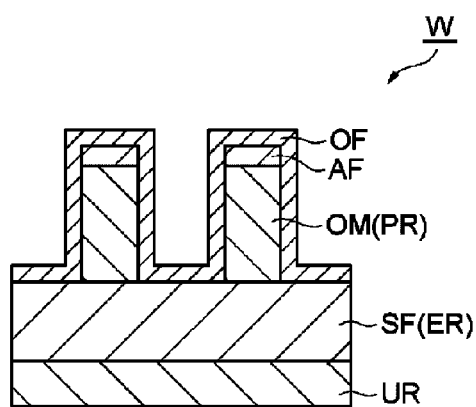
FIG. 7A is a partially enlarged cross sectional view illustrating a state of the still yet another example substrate after the process ST1 is performed.
Figure 7B:
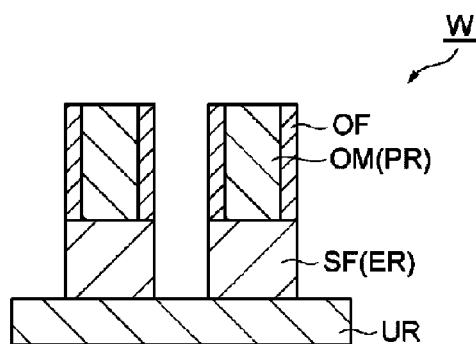
FIG. 7B is a partially enlarged cross sectional view illustrating a state of the still yet another example substrate after the process ST2 is performed.

Now, reference is made to FIG. 6A, FIG. 6B, FIG. 6C, FIG. 7A and FIG. 7B as well as FIG. 1. FIG. 6A is a partially enlarged cross sectional view of yet another example substrate to which the method MT is applicable; FIG. 6B, a partially enlarged cross sectional view illustrating a state of this yet another example substrate after an antireflection film is etched; and FIG. 6C, a partially enlarged cross sectional view illustrating a state of this yet another example substrate after an organic region is etched. FIG. 7A is a partially enlarged cross sectional view illustrating a state of this yet another example substrate after the process ST1 is performed, and FIG. 7B is a partially enlarged cross sectional view illustrating a state of this yet another example substrate after the process ST2 is performed. In the exemplary embodiment, the method MT is applied to the substrate W shown in FIG. 6A. In the exemplary embodiment, the method MT is performed by using the plasma processing apparatus 10. That is, the method MT is carried out in the state that the substrate W is placed in the first space S1, that is, the processing space. The substrate W illustrated in FIG. 6A is the same as the substrate W shown in FIG. 4A. In this substrate W, an organic mask OM to be described later may serve as a patterned region, that is a region PR, and a film SF becomes an etching target region, that is, a region ER.

In the method MT applied to the substrate W shown in FIG. 6A, plasma etching of an antireflection film AF is first performed. In the process for the plasma etching of the antireflection film AF, a processing gas is supplied into the processing space (first space S1). The processing gas includes a fluorocarbon gas (e.g., $CF_4$ gas). The processing gas may include a hydrofluorocarbon gas in addition to or instead of the fluorocarbon gas. Further, in this process, the gas exhaust device 52 is controlled such that the pressure within the processing space is set to a predetermined pressure. Furthermore, in this process, the first radio frequency power is supplied to excite the processing gas. Further, in this process, the second radio frequency power is supplied to the lower electrode 18. In this process, the antireflection film AF is etched by ions and/or radicals in plasma from the processing gas (see FIG. 6B).

Then, plasma etching of an organic region OR is performed. As a result, as depicted in FIG. 6C, the organic mask OM (that is, the region PR) is obtained from the organic region OR. This process for the plasma etching of the organic region OR is the same as the process described with reference to FIG. 5A.

Subsequently, as a result of performing the process ST1, as illustrated in FIG. 7A, an organic film OF is formed on the substrate W, that is, on a surface of the antireflection film AF, a surface of the organic mask OM (that is, the region PR) and a surface of the film SF. In the process ST1, since an oxygen gas is not provided, deformation of the organic mask OM (that is, the region PR) is suppressed.

Next, the process ST2 is performed to plasma-etch the film SF (region ER). The process ST2 for the plasma etching of the film SF (region ER) is the same as the process for the plasma etching of the film SF described with reference to FIG. 5B. As a result of performing this process ST2, the film SF (region ER) is etched, as illustrated in FIG. 7B.

Now, reference is made to FIG. 8A, FIG. 8B, FIG. 8C, FIG. 8D and FIG. 8E as well as FIG. 1. FIG. 8A is a partially enlarged cross sectional view of still yet another example substrate to which the method MT is applicable; FIG. 8B, a partially enlarged cross sectional view illustrating a state of this still yet another example substrate after a process STa is performed; and FIG. 8C, a partially enlarged cross sectional view illustrating a state of this still yet another example substrate after the process ST1 is performed; FIG. 8D, a partially enlarged cross sectional view illustrating a state of this still yet another example substrate after the process STb is performed; and FIG. 8E, a partially enlarged cross sectional view illustrating a state of this still yet another example substrate after the process ST2 is performed. In the exemplary embodiment, the method MT is applied to the substrate W shown in FIG. 8A. Further, in the exemplary embodiment, the method MT is performed by using the plasma processing apparatus 10. That is, the method MT is carried out in the state that the substrate W is placed in the first space S1, that is, the processing space.

The substrate W shown in FIG. 8A includes an underlying region UR, a region ER and a patterned layer PL. The region ER is provided on the underlying region UR. The region ER is a silicon film. The layer PL is provided on the region ER. The layer PL is made of silicon oxide. The layer PL is patterned. The layer PL is patterned to provide, for example, an opening.

The method MT applied to the substrate W shown in FIG. 8A further includes the process STa. In the process STa, plasma etching of the region ER is performed. In the process STa, the region ER is partially etched. To elaborate, the region ER is etched down to a position between a top surface (a surface at the layer PL side) and a bottom surface (a surface at the underlying region UR side) thereof in a film thickness direction.

In the process STa, a processing gas is supplied into the processing space (first space S1). The processing gas is a halogen-containing gas and includes, for example, HBr. The processing gas may include a $Cl_2$ gas in addition to or instead of the HBr gas. In the process STa, the gas exhaust device 52 is controlled such that the pressure within the processing space is set to a predetermined pressure. Furthermore, in the process STa, the first radio frequency power is supplied to excite the processing gas. Further, in the process STa, the second radio frequency power is supplied to the lower electrode 18. In the process STa, the region ER is etched by active species such as ions and radicals in plasma from the processing gas, so that an opening OP is formed (see FIG. 8B). A surface of the region ER forming and confining the opening OP includes a bottom surface ERB and a side surface ERS. The side surface ERS is continuous with a side surface PLS of the layer PL. As a result of performing the process STa, the patterned region PR is formed. The region PR includes the layer PL and a portion ERP of the region ER extended at a lateral side of the opening OP.

Subsequently, the process ST1 is performed. As a result of performing the process ST1, an organic film OF is formed on the substrate W, that is, on a surface of the layer PL and surfaces forming and confining the opening OP, as depicted in FIG. 8C. That is, the organic film OF is formed on a surface of the region PR and a surface (bottom surface ERB) of the region ER exposed from the region PR.

When necessary, the process STb is performed. As a result of performing the process STb, the organic film OF extended on the bottom surface ERB is removed (see FIG. 8D). Though plasma from a processing gas used in the process STb removes the organic film OF extended on the bottom surface ERB, it hardly damages the layer PL of the region PR.

Thereafter, the process ST2 is performed. In the process ST2, the plasma from the processing gas is generated, the same as in the process STa. As a result, as shown in FIG. 8E, the region ER is further etched. Further, while the process ST2 is being performed, the organic film OF extended on the side surface ERS suppresses the portion ERP of the region ER from being etched in a transversal direction. That is, etching of the patterned region PR in the transversal direction is suppressed.

The method MT may further include a process STc. In the process STc, the organic film OF is removed. The organic film OF can be removed by plasma generated from a processing gas in the processing space (first space S1). This processing gas includes, by way example, but not limitation, a nitrogen gas ($N_2$ gas) and a hydrogen gas ($H_2$ gas). In case that the organic film OF is composed of an organic compound generated by polymerization of isocyanate and amine or an organic compound generated by polymerization of isocyanate and a compound having a hydroxyl group, the organic film OF may be removed by heating the substrate W. A temperature of the substrate W for removing the organic film OF may be in the range from 250° C. to 400° C. If the substrate W is heated in this temperature range, depolymerization of the organic compound constituting the organic film OF takes place. A gas of the organic compound generated by the depolymerization is exhausted. Further, the substrate W may be heated by the one or more heaters 20h within the electrostatic chuck 20. The substrate W may be heated by the heater 72.

Now, reference is made to FIG. 9A, FIG. 9B, FIG. 9C and FIG. 9D as well as FIG. 1. FIG. 9A is a partially enlarged cross sectional view of still yet another example substrate to which the method MT is applicable; FIG. 9B, a partially enlarged cross sectional view illustrating a state of this still yet another example substrate after the process STa is performed; and FIG. 9C, a partially enlarged cross sectional view illustrating a state of this still yet another example substrate after the process ST1 is performed; and FIG. 9D, a partially enlarged cross sectional view illustrating a state of this still yet another example substrate after the process ST2 is performed. In the exemplary embodiment, the method MT is applied to the substrate W shown in FIG. 9A. Further, in the exemplary embodiment, the method MT is performed by using the plasma processing apparatus 10. That is, the method MT is carried out in the state that the substrate W is placed in the first space S1, that is, the processing space.

The substrate W shown in FIG. 9A includes an underlying region UR, a region ER and a patterned layer PL. The region ER is provided on the underlying region UR. The region ER is a porous film or a film with a low dielectric constant including silicon, oxygen, carbon and hydrogen. The layer PL is provided on the region ER. The layer PL is made of a material having resistance against the etching of the region ER, for example, an organic material or a metal-containing material. The metal-containing material may be, by way of non-limiting example, a titanium-containing material or a tungsten-containing material. The layer PL is patterned. The layer PL is patterned to provide, for example, an opening.

The method MT applied to the substrate W shown in FIG. 9A further includes the process STa. In the process STa, the plasma etching of the region ER is performed. In the process STa, the region ER is partially etched. To elaborate, the region ER is etched down to a position between a top surface (a surface at a layer PL side) and a bottom surface (a surface at an underlying region UR side) thereof in a film thickness direction.

In the process STa, a processing gas is supplied into the processing space (first space S1). The processing gas includes a fluorocarbon gas (e.g., $C_4F_8$ gas). The processing gas may further include a rare gas, a nitrogen gas ($N_2$ gas) and an oxygen gas ($O_2$ gas). The processing gas may include a hydrofluorocarbon gas in addition to or instead of the fluorocarbon gas. In the process STa, the gas exhaust device 52 is controlled such that the pressure within the processing space is set to a predetermined pressure. Furthermore, in the process STa, the first radio frequency power is supplied to excite the processing gas. In the process STa, the second radio frequency power is supplied to the lower electrode 18. In the process STa, the region ER is etched by active species such as ions and radicals in plasma from the processing gas (see FIG. 9B). A surface of the etching region ER generated by performing the process STa includes a bottom surface ERB and a side surface ERS. The side surface ERS is continuous with a side surface PLS of the layer PL. As a result of performing this process STa, a patterned region PR is formed. The region PR includes the layer PL and a portion ERP of the region ER extended at a lateral side of an opening OP.

Subsequently, the process ST1 is performed. As a result of performing the process ST1, as illustrated in FIG. 9C, an organic film OF is formed on the substrate W, that is, on a surface of the region PR (a surface of the layer PL and the side surface ERS of the portion ERP) and a surface (bottom surface ERB) of the region ER exposed from the region PR. In this process ST1, an oxygen gas is not provided. Accordingly, when the process ST1 is performed, oxidation of the region ER, that is, oxidation of the portion ERP constituting the region PR is suppressed.

When necessary, the process STb is performed. As a result of performing the process STb, the organic film OF extended on the bottom surface ERB is removed.

Subsequently, the process ST2 is performed. In the process ST2, the plasma from the processing gas is generated, the same as in the process STa. As a consequence, as illustrated in FIG. 9D, the region ER is further etched. Further, while the process ST2 is being performed, the organic film OF extended on the side surface ERS suppresses the active species from reaching the portion ERP of the region ER.

Then, the process STc may be performed. In the process STc, the organic film OF is removed. The organic film OF can be removed by plasma generated from a processing gas in the processing space (first space S1). This processing gas includes, by way of non-limiting example, a nitrogen gas ($N_2$ gas) and a hydrogen gas ($H_2$ gas). In case that the organic film OF is made of an organic compound generated by polymerization of isocyanate and amine or an organic compound generated by polymerization of isocyanate and a compound having a hydroxyl group, the organic film OF may be removed by heating the substrate W. A temperature of the substrate W for removing the organic film OF may be in the range from 250° C. to 400° C. If the substrate W is heated in this temperature range, depolymerization of the organic compound constituting the organic film OF takes place. A gas of the organic compound generated by the depolymerization is exhausted. Further, the substrate W may be heated by the one or more heaters 20h within the electrostatic chuck 20. The substrate W may be heated by the heater 72.

Figure 10:
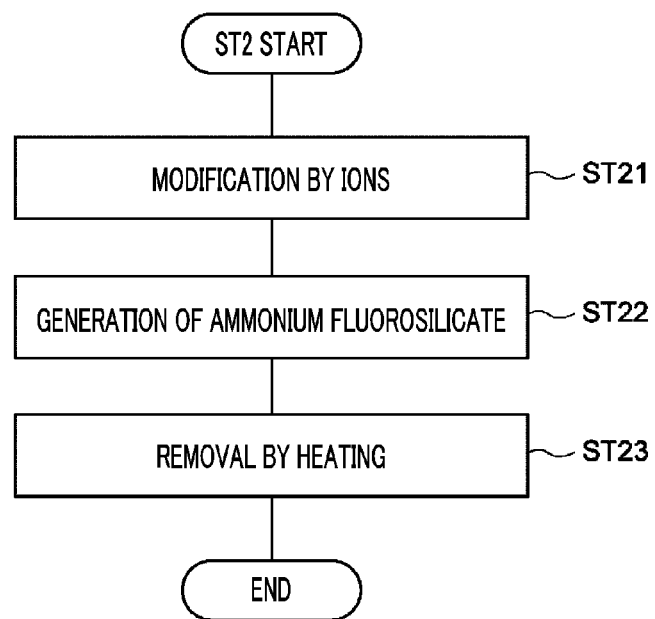
FIG. 10 is a flowchart illustrating an example of the process ST2 in the method MT.
Figure 11A:
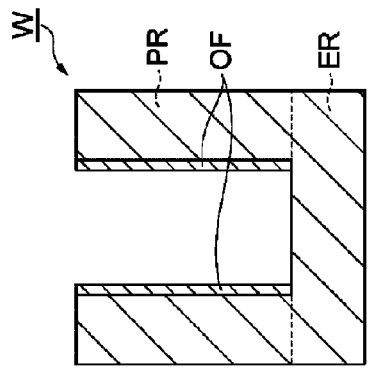
FIG. 11A is a partially enlarged cross sectional view illustrating still yet another example substrate to which the method MT is applicable.
Figure 11B:
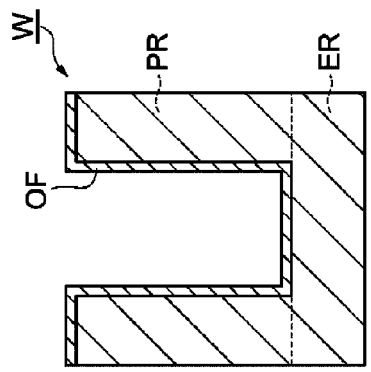
FIG. 11B is a partially enlarged cross sectional view illustrating a state of this still yet another example substrate after the process ST1 is performed.
Figure 11C:
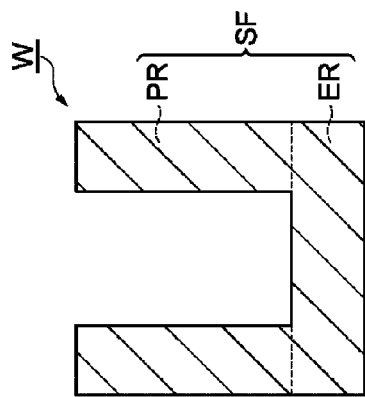
FIG. 11C is a partially enlarged cross sectional view illustrating a state of this still yet another example substrate after the process STb is performed.
Figure 11D:
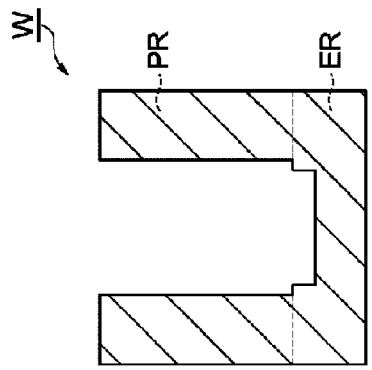
FIG. 11D is a partially enlarged cross sectional view illustrating a state of this still yet another example substrate after a process ST21 of FIG. 10 is performed.
Figure 11E:
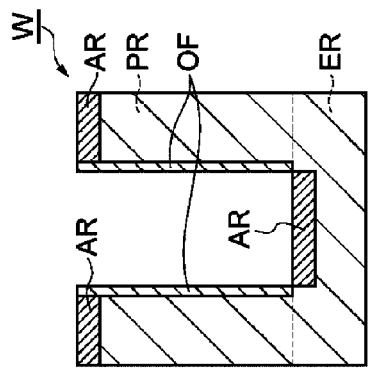
FIG. 11E is a partially enlarged cross sectional view illustrating a state of this still yet another example substrate after a process ST22 of FIG. 10 is performed.

Now, reference is made to FIG. 10, FIG. 11A, FIG. 11B, FIG. 11C, FIG. 11D, FIG. 11E and FIG. 11F as well as FIG. 1. FIG. 10 is a flowchart illustrating an example of the process ST2 in the method MT. FIG. 11A is a partially enlarged cross sectional view of still yet another example substrate to which the method MT is applicable; FIG. 11B, a partially enlarged cross sectional view illustrating a state of this still yet another example substrate after the process ST1 is performed; and FIG. 11C, a partially enlarged cross sectional view illustrating a state of this still yet another example substrate after the process STb is performed; and FIG. 11D, a partially enlarged cross sectional view illustrating a state of this still yet another example substrate after a process ST21 of FIG. 10 is performed; FIG. 11E, a partially enlarged cross sectional view illustrating a state of this still yet another example substrate after a process ST22 of FIG. 10 is performed; and FIG. 11F, a partially enlarged cross sectional view illustrating a state of this still yet another example substrate after a process ST23 of FIG. 10 is performed. In the exemplary embodiment, the method MT is applied to the substrate W shown in FIG. 11A. Further, in the exemplary embodiment, the method MT is performed by using the plasma processing apparatus 10. That is, the method MT is carried out in the state that the substrate W is placed in the first space S1, that is, the processing space.

The substrate W shown in FIG. 11A includes an etching target region, that is, a region ER; and a patterned region PR. The region ER and the region PR include silicon and oxygen. The region ER and the region PR are made of, by way of non-limiting example, silicon oxide. The region PR is extended on the region ER. The region PR is patterned to provide an opening. The region ER and the region PR may be formed of a single film SF.

In the method MT according to the exemplary embodiment, the process ST1 is performed on the substrate W shown in FIG. 11A. As a result of performing the process ST1, as illustrated in FIG. 11B, an organic film OF is formed on the substrate W, that is, on a surface of the region PR and a surface of the region ER exposed from the region PR. Then, the process STb is performed. As a result of performing the process STb, the organic film OF extended on a top portion of the region PR and a top surface of the region ER is removed, as illustrated in FIG. 11C.

Thereafter, the process ST2 is performed. As depicted in FIG. 10, the process ST2 includes the process ST21, the process ST22 and the process ST23. In the process ST21, a portion of the region ER including the top surface thereof is modified by ions, and a modified region MR is formed from this portion, as depicted in FIG. 11D. Further, in the process ST21, the top portion of the region PR is also modified by the ions to be a modified region MR.

In the process ST21, a processing gas is supplied into the processing space (first space S1). The processing gas may be an inert gas, a hydrogen gas or a mixed gas of one or more inert gases and the hydrogen gas. The inert gas may be a nitrogen gas or a rare as such as an Ar gas or a He gas. In the process ST21, the gas exhaust device 52 is controlled such that the pressure within the processing space is set to a predetermined pressure. Furthermore, in the process ST21, the first radio frequency power is supplied to excite the processing gas. Further, in the process ST21, the second radio frequency power is supplied to the lower electrode 18. In the process ST21, ions in plasma from the processing gas are supplied to the substrate, so that the modified region MR is formed.

In the subsequent process ST22, a processing is performed to alter the modified region MR, so that, as shown in FIG. 11E, an altered region AR is formed from the modified region MR. The altered region AR is made of ammonium fluorosilicate. In the process ST22, a processing gas is supplied into the processing space (first space S1). The processing gas includes fluorine, nitrogen and hydrogen. The processing gas may be, by way of example, but not limitation, a mixed gas including a $NF_3$ gas and a $NH_3$ gas, a mixed gas including a $NF_3$ gas and a hydrogen gas, or a mixed gas including a HF gas and a $NH_3$ gas. In the process ST22, the gas exhaust device 52 is controlled such that the pressure within the processing space is set to a predetermined pressure. Furthermore, in the process ST22, the first radio frequency power is supplied to excite the processing gas. In the process ST22, the second radio frequency power may or may not be supplied to the lower electrode 18. In the process ST22, a temperature of the substrate W is set to be equal to or higher than 10° C. and less than 80° C. In the process ST22, the ammonium fluorosilicate is generated from materials constituting the modified region MR by active species of ions and radicals in plasma from the processing gas. As a result, the altered region AR is formed from the modified region MR.

Figure 11F:
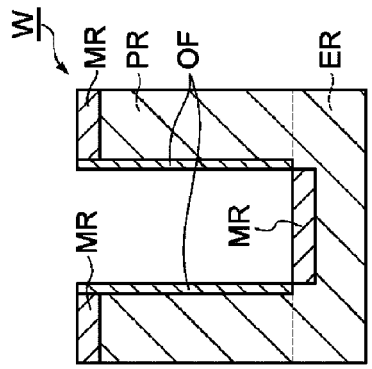
FIG. 11F is a partially enlarged cross sectional view illustrating a state of this still yet another example substrate after a process ST23 of FIG. 10 is performed.

In the subsequent process ST23, the altered region AR and the organic film OF are removed, as depicted in FIG. 11F. The altered region AR and the organic film OF are removed by heating the substrate W. The organic film OF is removed as a result of depolymerization by heating. As stated above, this organic film OF may be made of the organic compound generated by the polymerization of isocyanate and amine or the organic compound generated by the polymerization of isocyanate and the compound having the hydroxyl group. A temperature of the substrate W for removing the organic film OF may be in the range from 250° C. to 400° C. If the substrate W is heated in this temperature range, depolymerization of the organic compound constituting the organic film OF takes place. A gas of the organic compound generated by the depolymerization is exhausted. Further, if the substrate W is heated to this temperature, the altered region AR is also removed. The substrate W may be heated by the one or more heaters 20h within the electrostatic chuck 20. The substrate W may be heated by the heater 72.

According to the above exemplary embodiment, it is possible to etch the region ER while protecting the sidewall surface of the patterned region PR by the organic film OF. Further, the organic film OF can be removed without using oxygen plasma, and the organic film OF can be removed along with the modified region MR.

Figure 12:
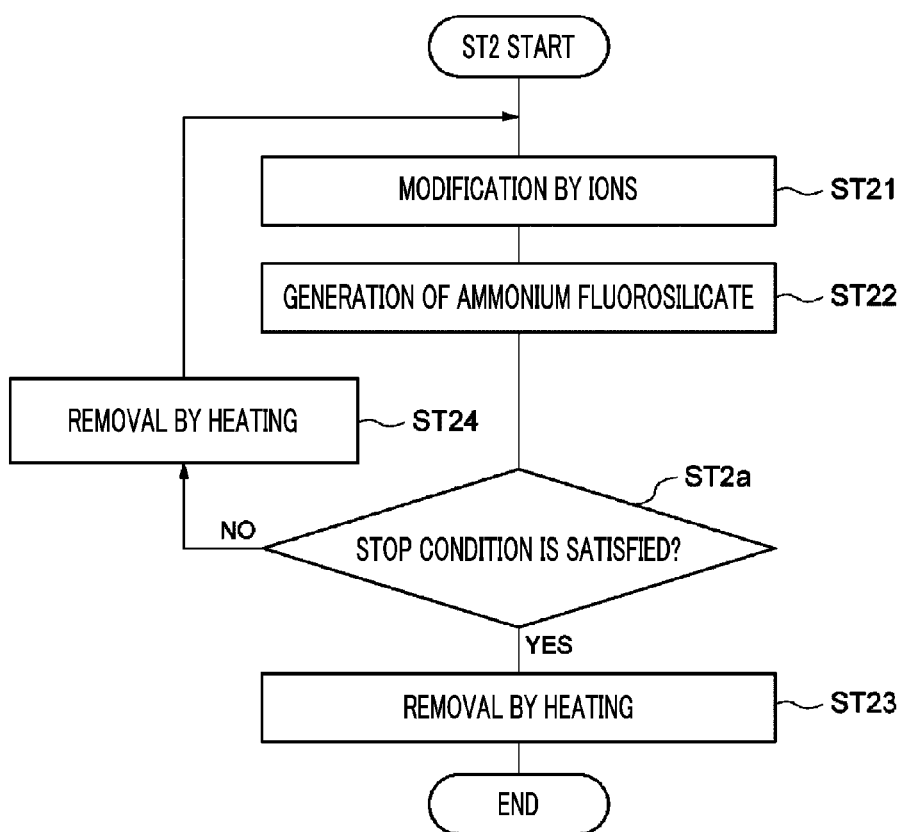
FIG. 12 is a flowchart illustrating another example of the process ST2 in the method MT.
Figure 13C:
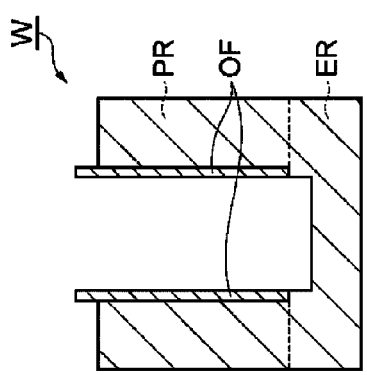
FIG. 13C is a partially enlarged cross sectional view illustrating a state of this still yet another example substrate after a process ST23 of FIG. 12 is performed.
Figure 13B:
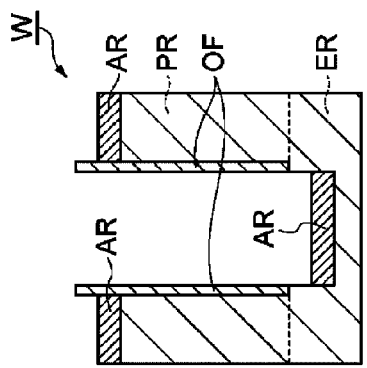
FIG. 13B is a partially enlarged cross sectional view illustrating a state of the still yet another example substrate after a process ST21 and a process ST22 of FIG. 12 are performed.
Figure 13A:
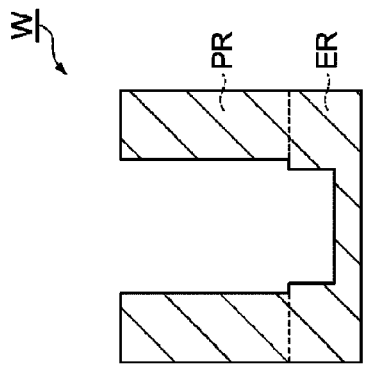
FIG. 13A is a partially enlarged cross sectional view illustrating still yet another example substrate after a process ST24 of FIG. 12 is performed.

Now, reference is made to FIG. 12, FIG. 13A, FIG. 13B and FIG. 13C. FIG. 12 is a flowchart illustrating yet another example of the process ST2 in the method MT. FIG. 13A is a partially enlarged cross sectional view illustrating a state of still yet another example substrate after a process ST24 of FIG. 12 is performed; FIG. 13B, a partially enlarged cross sectional view illustrating a state of this still yet another example substrate after a process ST21 and a process ST22 of FIG. 12 are performed; and FIG. 13C, a partially enlarged cross sectional view illustrating a state of this still yet another example substrate after a process ST23 of FIG. 12 is performed.

As depicted in FIG. 12, in the method MT according to the exemplary embodiment, a process ST2a may be performed after the process ST21 and the process ST22. In the process ST2a, it is determined whether a stop condition is satisfied. In the process ST2a, the stop condition is satisfied when a repetition number of a sequence including the process ST21 and the process ST22 reaches a preset number of times. The preset number of times may be equal to or larger than two.

If it is determined in the process ST2a that the stop condition is not satisfied, the process ST24 is carried out. The process ST24 is performed on the substrate W after being subjected to the process ST22 (for example, the substrate W shown in FIG. 11E). In the process ST24, the altered region AR in the substrate W is selectively removed with respect to the organic film OF, as shown in FIG. 13A. In the process ST24, the substrate W is heated. In the process ST24, a temperature of the substrate W is set to a temperature at which the altered region AR can be selectively removed with respect to the organic film OF. In the process ST24, the temperature of the substrate W is set to a temperature at which the ammonium fluorosilicate of the altered region AR turns into a gas but the depolymerization of the organic compound constituting the organic film OF does not take place. The temperature of the substrate W set in the process ST24 is lower than, e.g., 250° C. The temperature of the substrate W set in the process ST24 is, e.g., 100° C. In the process ST24, the substrate W can be heated by the one or more heaters 20h within the electrostatic chuck 20. The substrate W may be heated by the heater 72.

After the process ST24, the sequence including the process ST21 and the process ST22 is performed again. As a result, as depicted in FIG. 13B, the altered region AR is further formed.

If it is determined in the process ST2a that the stop condition is met, the aforementioned process ST23 is carried out. As a consequence, as shown in FIG. 13C, the organic film OF and the altered region AR are removed.

Figure 14:
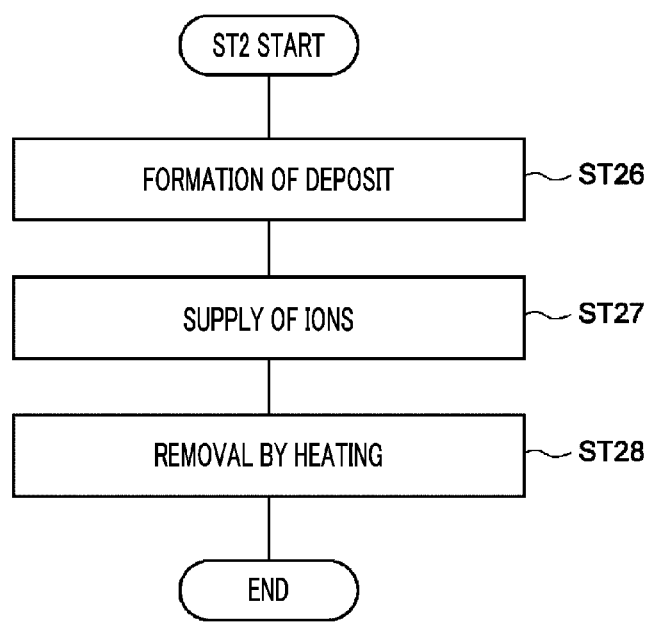
FIG. 14 is a flowchart illustrating yet another example of the process ST2 in the method MT.
Figure 15A:
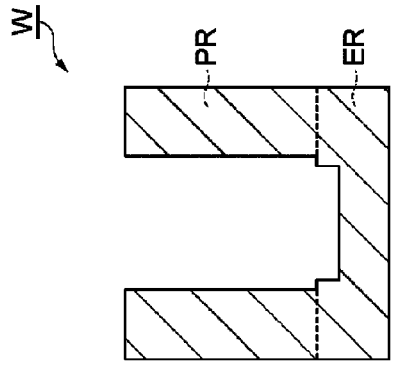
FIG. 15A is a partially enlarged cross sectional view illustrating still yet another example substrate after a process ST26 of FIG. 14 is performed.
Figure 15B:
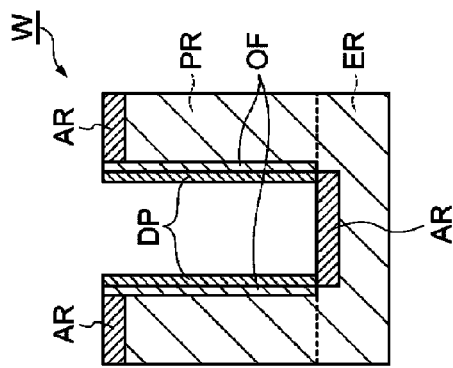
FIG. 15B is a partially enlarged cross sectional view illustrating a state of this still yet another example substrate after a process ST27 of FIG. 14 is performed.

Now, reference is made to FIG. 14, FIG. 15A, FIG. 15B and FIG. 15C. FIG. 14 is a flowchart illustrating still another example of the process ST2 in the method MT. FIG. 15A is a partially enlarged cross sectional view illustrating a state of still yet another example substrate after a process ST26 of FIG. 14 is performed; FIG. 15B, a partially enlarged cross sectional view illustrating a state of this still yet another example substrate after a process ST27 of FIG. 14 is performed; and FIG. 15C, a partially enlarged cross sectional view illustrating a state of this still yet another example substrate after a process ST28 of FIG. 14 is performed.

As depicted in FIG. 14, in the process ST2 of the method MT according to the exemplary embodiment, the process ST26 may be performed. The process ST26 is performed on the substrate W after being subjected to the process STb (for example, the substrate W shown in FIG. 11C). In the process ST26, plasma is generated from a processing gas, and chemical species in the plasma form a deposit DP on the substrate W, as illustrated in FIG. 15A.

In the process ST26, a processing gas is supplied into the processing space (first space S1). In the process ST26, the same processing gas as used in the process ST22 is provided. In the process ST26, the gas exhaust device 52 is controlled such that the pressure within the processing space is set to a predetermined pressure. Further, in the process ST26, the first radio frequency power is supplied to excite the processing gas. In the process ST26, the second radio frequency power may or may not be supplied to the lower electrode 18. In the process ST26, a temperature of the substrate W is set to allow the chemical species in the plasma to form the deposit DP on the substrate W while suppressing the chemical species from reacting with the region PR and the region ER. The temperature of the substrate W in the process ST26 is, for example, lower than 10° C.

In the subsequent process ST27, ions are supplied to the substrate W. The process ST27 is the same as the process ST21. In the process ST27, the ions supplied to the substrate W accelerate a reaction between the chemical species forming the deposit DP and the region ER. As a result, as shown in FIG. 15B, the altered region AR is formed from a portion including the top surface of the region ER. Further, the ions supplied to the substrate W accelerate a reaction between the chemical species forming the deposit DP and the top portion of the region PR. As a consequence, the altered region AR is formed from the top portion of the region PR. The altered region AR is made of ammonium fluorosilicate.

Figure 15C:
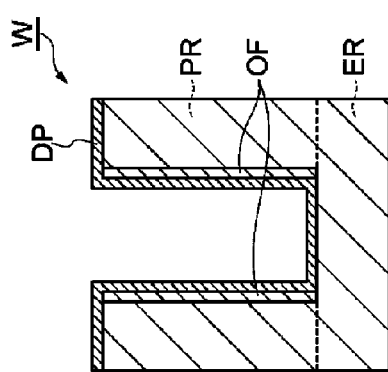
FIG. 15C is a partially enlarged cross sectional view illustrating a state of this still yet another example substrate after a process ST28 of FIG. 14 is performed.

The subsequent process ST28 is the same as the process ST23. In the process ST28, the altered region AR and the organic film OF are removed, as illustrated in FIG. 15C. In the process ST28, to remove the altered region AR and the organic film OF, the substrate W is heated to the same temperature as the temperature of the substrate W in the process ST23.

Figure 16:
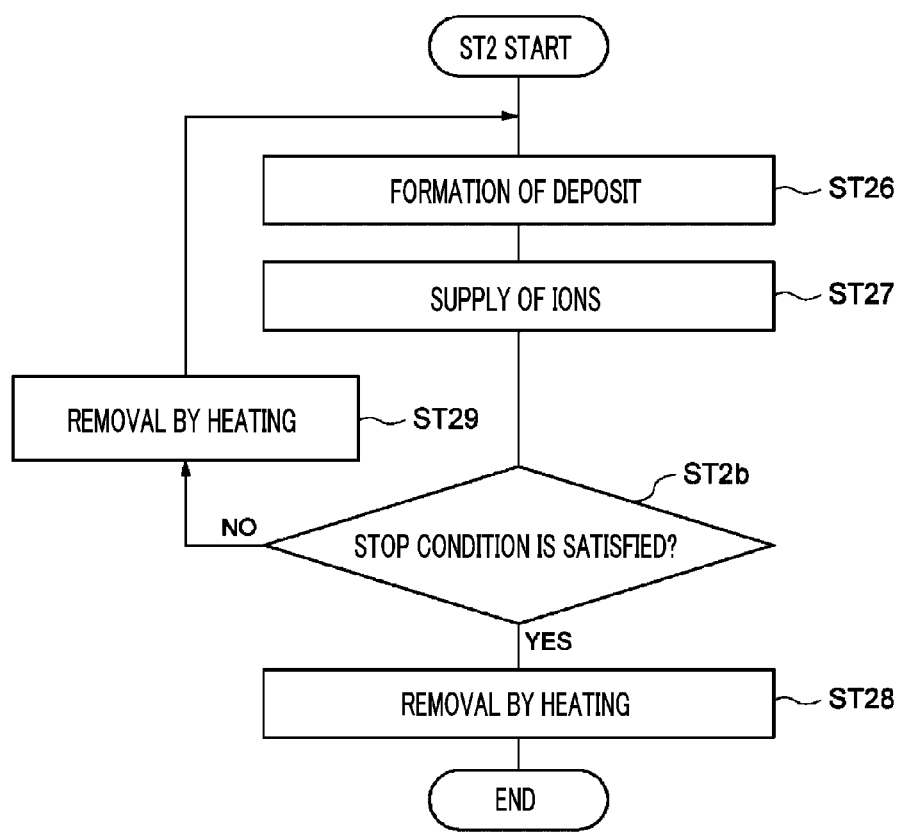
FIG. 16 is a flowchart illustrating still yet another example of the process ST2 in the method MT.

Now, reference is made to FIG. 16, FIG. 17A, FIG. 17B and FIG. 17C. FIG. 16 is a flowchart illustrating still yet another example of the process ST2 in the method MT. FIG. 17A is a partially enlarged cross sectional view illustrating a state of still yet another example substrate after a process ST29 of FIG. 16 is performed; FIG. 17B, a partially enlarged cross sectional view illustrating a state of this still yet another example substrate after a process ST26 and a process ST27 of FIG. 16 are performed; and FIG. 17C, a partially enlarged cross sectional view illustrating a state of this still yet another example substrate after a process ST28 of FIG. 16 is performed.

As illustrated in FIG. 16, in the method MT according to the exemplary embodiment, a process ST2b may be performed after the process ST26 and the process ST27. In the process ST2b, it is determined whether a stop condition is satisfied. In the process ST2b, the stop condition is satisfied when a repetition number of a sequence including the process ST26 and the process ST27 reaches a preset number of times. The preset number of times may be equal to or larger than two.

If it is determined in the process ST2b that the stop condition is not met, the process ST29 is performed. The process ST29 is performed on the substrate W after being subjected to the process ST27 (for example, the substrate W shown in FIG. 15B). In the process ST29, the altered region AR is selectively etched with respect to the organic film OF, as shown in FIG. 17A. The process ST29 is the same as the process ST24. In the process ST29, a temperature of the substrate W is set to a temperature at which the ammonium fluorosilicate of the altered region AR turns into a gas but the depolymerization of the organic compound forming the organic film OF does not take place. The temperature of the substrate W set in the process ST29 is lower than, e.g., 250° C. The temperature of the substrate W set in the process ST29 is, e.g., 100° C. In the process ST29, the substrate W can be heated by the one or more heaters 20h within the electrostatic chuck 20. The substrate W may be heated by the heater 72.

After the process ST29 is performed, the sequence including the process ST26 and the process ST27 is performed again. As a result, as depicted in FIG. 17B, the altered region AR is further formed.

If it is determined in the process ST2b that the stop condition is met, the aforementioned process ST28 is carried out. As a consequence, as shown in FIG. 17C, the organic film OF and the altered region AR are removed.

Figure 18A:
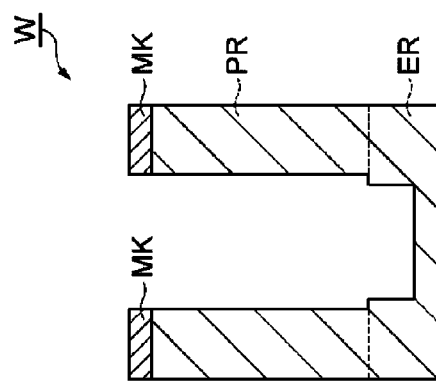
FIG. 18A is a partially enlarged cross sectional view illustrating still yet another example substrate to which the method MT is applicable.
Figure 18B:
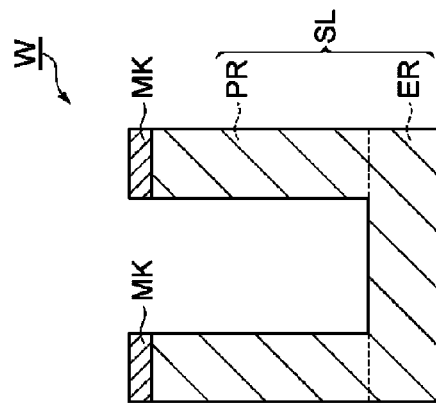
FIG. 18B is a partially enlarged cross sectional view illustrating the still yet another example substrate after the method MT is performed.

Now, reference is made to FIG. 18A and FIG. 18B. The substrate W shown in FIG. 11A may have a mask MK on the top portion of the region PR, as depicted in FIG. 18A. The mask MK is made of a material having resistance against the etching of the region ER, for example, an organic material, a metal-containing material or a silicon-containing material. As an example of the metal-containing material, a titanium-containing material or a tungsten-containing material may be used. An example of the silicon-containing material may be silicon or silicon nitride. The method MT according to the above-described exemplary embodiment including the process ST2 described in FIG. 10, FIG. 12, FIG. 14 or FIG. 16 may be applied to the substrate W shown in FIG. 18A. When this method MT is applied to the substrate W shown in FIG. 18A, the top portion of the region PR is not etched, as illustrated in FIG. 18B, since the mask MK is extended on the top portion of the region PR.

Further, the region ER and the region PR of the substrate W shown in FIG. 18A may be formed of a single film SL. The single film SL may be made of, by way of non-limiting example, silicon oxide. The region ER and the region PR may be formed through the plasma etching of the process STa upon the single film SL. In the process STa, a processing gas is supplied into the processing space (first space S1). In case that the single film SL is a silicon oxide film, the processing gas includes a fluorocarbon gas (e.g., $C_4F_8$ gas). The processing gas may further include other gases such as a rare gas and an oxygen gas ($O_2$ gas). In the process STa, the gas exhaust device 52 is controlled such that the pressure within the processing space is set to a predetermined pressure. Further, in the process STa, the first radio frequency power is supplied to excite the processing gas. In the process STa, the second radio frequency power is supplied to the lower electrode 18. As a result of performing the process STa, a portion of the single film SL exposed from the mask MK is etched, so that the region PR and the region ER are formed.

Figure 19:
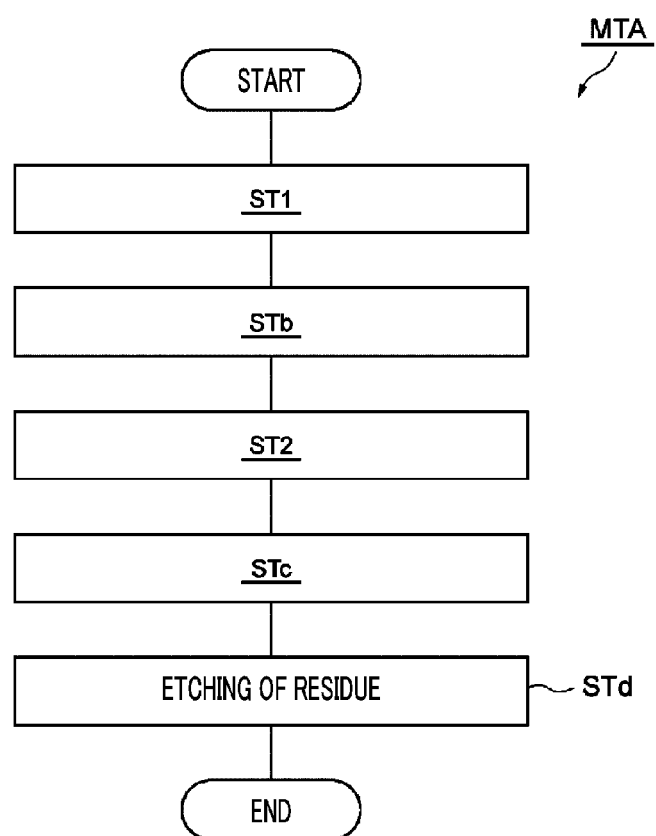
FIG. 19 is a flowchart illustrating a method of processing a substrate according to another exemplary embodiment.
Figures 20A, 20B, 20C, 20D, 20E, 20F:
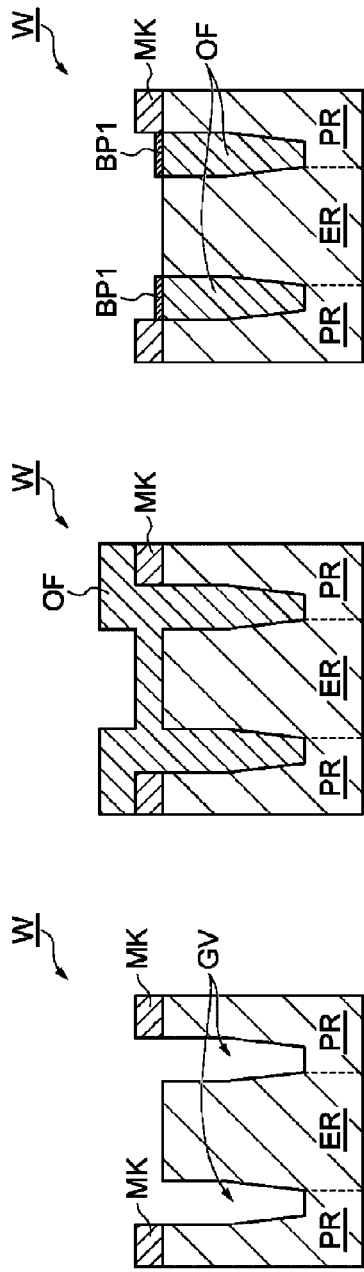
FIG. 20A is a partially enlarged cross sectional view illustrating still yet another example substrate to which a method MTA shown in FIG. 19 is applicable.
FIG. 20B is a partially enlarged cross sectional view illustrating the still yet another example substrate after a process ST1 of the method MTA is performed.
FIG. 20C is a partially enlarged cross sectional view illustrating a state of the still yet another example substrate after a process STb of the method MTA is performed.
FIG. 20D is a partially enlarged cross sectional view illustrating a state of the still yet another example substrate after a process ST2 of the method MTA is performed.
FIG. 20E is a partially enlarged cross sectional view illustrating a state of the still yet another example substrate after the process STc of the method MTA is performed.
FIG. 20F is a partially enlarged cross sectional view illustrating a state of still yet another example substrate after a process STd of the method MTA is performed.

Now, reference is made to FIG. 19, FIG. 20A, FIG. 20B, FIG. 20C, FIG. 20D, FIG. 20E and FIG. 20F. FIG. 19 is a flowchart illustrating a method of processing a substrate according to another exemplary embodiment. FIG. 20A is a partially enlarged cross sectional view of an example substrate to which a method MTA shown in FIG. 19 is applicable; FIG. 20B, a partially enlarged cross sectional view illustrating a state of the example substrate after a process ST1 of the method MTA is performed; FIG. 20C, a partially enlarged cross sectional view illustrating a state of the example substrate after a process STb of the method MTA is performed; FIG. 20D, a partially enlarged cross sectional view illustrating a state of the example substrate after a process ST2 of the method MTA is performed; FIG. 20E, a partially enlarged cross sectional view illustrating a state of the example substrate after the process STc of the method MTA is performed; and FIG. 20F, a partially enlarged cross sectional view illustrating a state of the example substrate after a process STd of the method MTA is performed. The method MTA shown in FIG. 19 may be applicable to the substrate W shown in FIG. 20A. Further, in the present exemplary embodiment, the method MTA is performed by using the plasma processing apparatus 10. That is, the method MTA is performed in the state that the substrate W is placed in the first space S1, that is, the processing space.

The substrate W shown in FIG. 20A includes an etching target region, that is, a region ER; a patterned region PR; and a mask MK. The region ER and the region PR are made of a same material. The region ER and the region PR are made of a material containing silicon. The region ER and the region PR are made of, by way of example, but not limitation, a material having a low dielectric constant. The material having the low dielectric constant includes, for example, silicon, oxygen, carbon and hydrogen. The mask MK is provided on a top portion of the region PR. The mask MK is made of a material having resistance against etching of the region ER, for example, an organic material or a metal-containing material. An example of the metal-containing material may be a titanium-containing material or a tungsten-containing material. The region ER may be surrounded by a side surface of the region PR or inserted between a pair of side surfaces of the region PR. An opening GV (for example, a groove) may be provided between the region ER and the region PR.

The region ER and the region PR may be formed of a single film (e.g., a film with a low dielectric constant or a porous film). That is, the region PR may be formed by performing the plasma etching of the process STa upon the single film. This plasma etching may be the same as the plasma etching of the process STa performed on the substrate W of FIG. 9A. Further, a processing gas used in the process STa is selected based on a material of the single film.

In the method MTA, the process ST1 is performed on the substrate W shown in FIG. 20A. That is, the sequence including a process ST11 and a process ST12 is performed one or more times. As a result of performing the process ST1, an organic film OF is formed on the substrate W, that is, on a surface of the mask MK, a surface of the region PR and a surface of the region ER, as depicted in FIG. 20B. The organic film OF fills the opening GV. That is, the organic film OF covers the side surface (or the pair of side surfaces) of the region PR.

In the method MTA, the process STb is subsequently performed. As a result of performing the process STb, the organic film OF extended on a top surface of the region ER is etched such that the organic film OF is left along the side surface (or the pair of side surfaces) of the region PR, that is, within the groove GV, as shown in FIG. 20C. Further, as a result of performing the process STb, a byproduct BP1 is deposited on the organic film OF, as illustrated in FIG. 20C. The byproduct BP1 includes carbon. Further, the byproduct BP1 may further include nitrogen.

In the method MTA, the process ST2 is then performed. In the process ST2, plasma etching of the region ER is performed, as depicted in FIG. 20D. The plasma etching of the process ST2 in the method MTA is the same as the plasma etching of the aforementioned process ST2 for forming the substrate W shown in FIG. 9D. Further, a processing gas used in the process ST2 is selected based on a material of the region ER. As a result of performing the process ST2, a byproduct BP2 is formed on the byproduct BP1 and the organic film OF, as shown in FIG. 20D. The byproduct BP2 includes chemical species in plasma generated in the process ST2 and the material (e.g., silicon) forming the region ER.

In the method MTA, the process STc is subsequently performed. In the process STc, the organic film OF is removed, as illustrated in FIG. 20E. The organic film OF is removed by heating the substrate W. The organic film OF is removed as a result of depolymerization by the heating. As stated above, this organic film OF may be composed of the organic compound generated by the polymerization of isocyanate and amine or the organic compound generated by the polymerization of isocyanate and the compound having the hydroxyl group. A temperature of the substrate W for removing the organic film OF may be in the range from 250° C. to 400° C. If the substrate W is heated, depolymerization of the organic compound constituting the organic film OF takes place. A gas of the organic compound generated by the depolymerization is exhausted. Further, the substrate W may be heated by the one or more heaters 20h within the electrostatic chuck 20. The substrate W may be heated by the heater 72.

Upon the completion of the process STc, a residue RS is formed, as illustrated in FIG. 20E. The residue RS is formed of the byproduct BP1 and/or the byproduct BP2. To remove the residue RS, the process STd is performed in the method MTA. In the process STd, plasma etching is performed in the same way as in the process ST2. As a result of the plasma etching of the process STd, the residue RS is removed, as depicted in FIG. 20F.

So far, the various exemplary embodiments have been discussed. However, the above-described exemplary embodiments are not limiting, and various changes and modifications may be made. By way of example, the method MT and the method MTA may be performed by using a plasma processing apparatus other than the plasma processing apparatus 10. For example, such a plasma processing apparatus may be an inductively coupled plasma processing apparatus or a plasma processing apparatus configured to generate plasma by a surface wave such as microwave.

Furthermore, in the method MT and the method MTA, the processes other than the process ST1 may be performed by using an apparatus different from the one used in the process ST1. By way of example, the apparatus used in the process ST1 and an apparatus used in the process ST2 may be different.

Now, experiments conducted to evaluate the method MT and the method MTA will be explained. However, it should be noted that the present disclosure is not limited to the following experiments.

First Experiment

In the first experiment, the process ST1 is performed by using the plasma processing apparatus 10, and thicknesses of organic films formed on multiple samples are measured. In the first experiment, the processing time of the process ST12 is set to be different for the individual samples.

Below, conditions for the process ST1 in the first experiment are specified.

Figure 21:
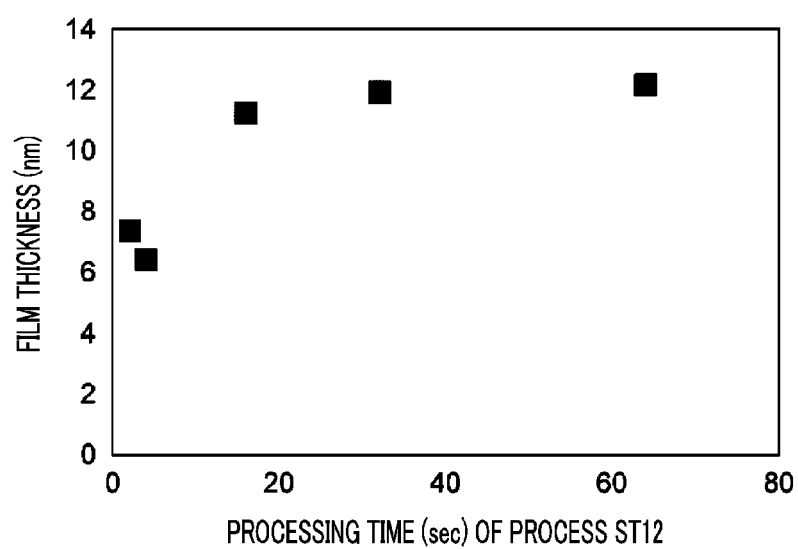
FIG. 21 is a graph showing a result of a first experiment.

Repetition number of the sequence: 15 times
Process ST11
   First organic compound: 1,3-bis(isocyanate methyl) cyclohexane
   Flow rate of the first gas: 10 sccm
   Pressure within the processing space: 500 mTorr (66.66 Pa)
   Temperature of sample: 65° C.
   Processing time: 8 sec
Process STPa
   Inert gas: $N_2$ gas of 200 sccm
   Pressure within the processing space: 500 mTorr (66.66 Pa)
   Temperature of sample: 65° C.
   Processing time: 16 sec
Process ST12
   Second organic compound: 1,3-bis(amino methyl)cyclohexane
   Flow rate of the second gas: 30 sccm
   Pressure within the processing space: 500 mTorr (66.66 Pa)
   Temperature of sample: 65° C.
Process STPb
   Inert gas: $N_2$ gas of 200 sccm
   Pressure within the processing space: 500 mTorr (66.66 Pa)
   Temperature of sample: 65° C.
   Processing time: 16 sec In the first experiment, a relationship between the processing time of the process ST12 and the thickness of the organic film OF is investigated. FIG. 21 shows the result. On a graph of FIG. 21, a horizontal axis represents the processing time of the process ST12, and a vertical axis indicates the thickness of the organic film OF. As can be seen from FIG.

21, the thickness of the organic film OF is saturated when the processing time of the process ST12 is equal or longer than a preset time. Thus, it is found out that, according to the process ST1, self-limiting function is achieved, the same as in the atomic layer deposition method.

Second Experiment

In the second experiment, the process ST1 is performed by using the plasma processing apparatus 10, and thicknesses of organic films formed on multiple samples are measured. In the second experiment, the repetition number of the sequence is set to be different for the individual samples. The other conditions for the process ST1 in the second experiment are the same as those for the process ST1 in the first experiment. Further, the processing time of the process ST12 in the second experiment is set to be 32 sec.

Figure 22:
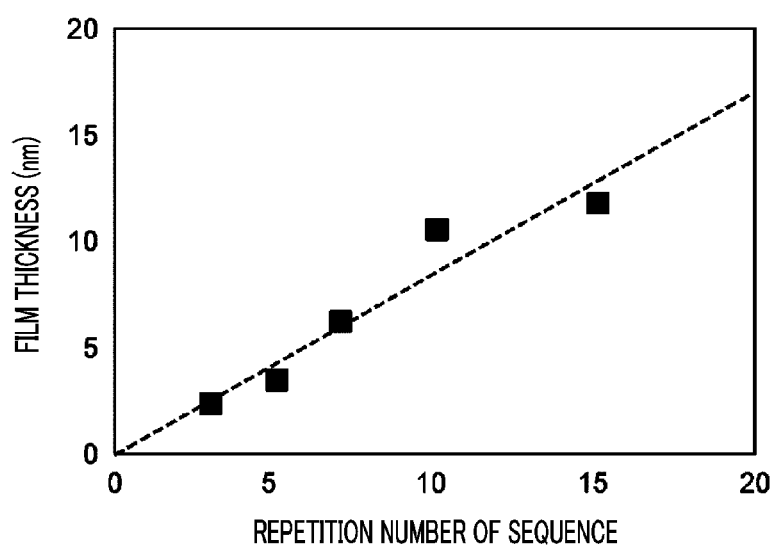
FIG. 22 is a graph showing a result of a second experiment.

In the second experiment, a relationship between the repetition number of the sequence in the process ST1 and the thickness of the organic film OF is investigated. FIG. 22 shows the result. On a graph of FIG. 22, a horizontal axis represents the repetition number of the sequence in the process ST1, and a vertical axis indicates the thickness of the organic film OF. As can be seen from FIG. 22, the thickness of the organic film OF is proportional to the repetition number of the sequence in the process ST1. From this result, it is found out that the thickness of the organic film OF can be adjusted by adjusting the repetition number of the sequence in the process ST1.

Third Experiment

In the third experiment, the organic film formed by performing the process ST1 and the silicon oxide film are etched by using the plasma processing apparatus 10. Conditions for the process ST1 in the third experiment are the same as those for the process ST1 in the first experiment. Further, in the third experiment, the processing time of the process ST12 is set to be 32 sec.

Below, conditions for the etching in the third experiment are specified.

Processing gas
    $C_4F_6$ gas: 5 sccm
    Ar gas: 1000 sccm
    $O_2$ gas: 5 sccm
Pressure within the processing space: 30 mTorr (4 Pa)
First radio frequency power: 40 MHz, 350 W
Second radio frequency power: 0 W In the third experiment, an etching rate of the organic film and an etching rate of the silicon oxide film are obtained. The etching rate of the organic film is found to be 5.2 nm/min, and the etching rate of the silicon oxide film is found to be 29.7 nm/min. From this result, it is found out that most of the organic film formed in the process ST1 is not etched in the etching of the silicon oxide film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. An apparatus for substrate processing, comprising:
at least one chamber including a first chamber, the first chamber having at least one gas inlet and at least one gas outlet;
a substrate support disposed in the first chamber; and
a controller configured to cause:
(a) disposing a substrate on the substrate support, the substrate having an etching layer and a patterned layer directly on the etching layer;
(b) forming an organic film on the patterned layer and an exposed surface of the etching layer by:
(b-1) supplying a first organic compound to the substrate;
(b-2) supplying a second organic compound to the substrate, the second organic compound being different from the first organic compound; and
(b-3) polymerizing the first organic compound and the second organic compound on the substrate;
(c) etching the etching layer with a plasma,
wherein in (b-1), the first organic compound supplied to the substrate is isocyanate, carboxylic acid, carboxylic halide, or carboxylic anhydride,
wherein the apparatus further comprises at least one heater,
wherein the controller is configured to maintain the substrate on the substrate support at a predetermined temperature with the at least one heater during (b), and
wherein:
in (c), the etching layer is etched by:
(c-1) altering an exposed region of the etching layer into a region containing ammonium fluorosilicate; and
(c-2) removing the altered region by heating the substrate with the at least one heater.

2. The apparatus according to claim 1, wherein:
the at least one heater is disposed in the substrate support.

3. The apparatus according to claim 1,
wherein the at least one heater includes a plurality of heaters disposed in the substrate support,
wherein the controller is further configured to cause:
during (b), adjusting temperatures of a plurality of regions of the substrate support by individually adjusting an electric power supplied to each of the plurality of heaters.

4. The apparatus according to claim 1, wherein:
the first chamber comprises:
a first space for processing the substrate;
a second space connected to an exhaust device; and
a partition wall including a plurality of through holes extended over a boundary between the first space and the second space and connecting the first space and the second space with each other.

5. The apparatus according to claim 1, wherein the at least one gas inlet includes a first gas inlet and a second gas inlet, wherein the first organic compound is supplied from the first gas inlet to the first chamber, and the second organic compound is supplied from the second gas inlet to the first chamber.

6. The apparatus according to claim 1, wherein;
the controller is further configured to cause:
(d) after (c), heating the substrate with the at least one heater to remove the organic film.

7. The apparatus according to claim 6, wherein during (d), the substrate is maintained at a temperature in a range of 250° C. to 400° C.

8. The apparatus according to claim 1, wherein:
the etching layer is etched in a capacitively-coupled plasma processing apparatus.

9. The apparatus according to claim 1, wherein:
in (c-1), the exposed region of the etching layer is altered into the region containing ammonium fluorosilicate by:
(c-11) generating a first plasma from a first processing gas containing an inert gas and/or a hydrogen gas to modify the exposed region of the etching layer; and
(c-12) generating a second plasma from a second processing gas containing fluorine, nitrogen and hydrogen to alter the modified region into the altered region.

10. The apparatus according to claim 9, wherein:
in (c-12), the substrate is maintained at a temperature in a range of 10° C. to 80° C.

11. The apparatus according to claim 1, wherein:
in (c-1), the exposed region of the etching layer is altered into the region containing ammonium fluorosilicate by:
(c-11) generating a first plasma from a first processing gas containing fluorine, nitrogen and hydrogen to form a deposit on the patterned layer; and
(c-12) generating a second plasma from a second processing gas containing an inert gas and/or a hydrogen gas to alter the deposit into the altered region.

12. The apparatus according to claim 11, wherein:
in (c-11), the substrate is maintained at a temperature to prevent chemical species in the first plasma from reacting with the patterned layer and the etching layer while the chemical species form the deposit on the substrate.

13. The apparatus according to claim 11, wherein:
in (c-11), the substrate is maintained at a temperature of below 10° C.

14. The apparatus according to claim 1, wherein:
in (c-2), the substrate is maintained at a temperature in a range of 250° C. to 400° C. to remove the organic film and the altered region.

15. The apparatus according to claim 1, wherein:
in (c-2), the altered region is selectively removed with respect to the organic film.

16. The apparatus according to claim 15, wherein:
in (c-2), the controller is configured to maintain the substrate at a temperature of below 250° C.

17. The apparatus according to claim 1, wherein the substrate having a mask on the patterned layer, the mask being made of organic material, metal-containing material or silicon-containing material.

18. An apparatus for substrate processing comprising:
at least one chamber including a first chamber, the first chamber having at least one gas inlet and at least one gas outlet, and
a controller configured to cause:
(a) disposing a substrate in the first chamber, the substrate having an etching layer and a patterned layer directly on the etching layer;
(b) forming an organic film on the patterned layer and an exposed surface of the etching layer by:
(b-1) supplying a first organic compound to the substrate;
(b-2) supplying a second organic compound to the substrate, the second organic compound being different from the first organic compound; and
(b-3) polymerizing the first organic compound and the second organic compound on the substrate; and
(c) etching the etching layer,
wherein in (b-1), the first organic compound supplied to the substrate is isocyanate, carboxylic acid, carboxylic halide, or carboxylic anhydride,
wherein the apparatus further comprises at least one heater,
wherein the controller is configured to maintain the substrate on the substrate support at a predetermined temperature with the at least one heater during (b), and
wherein:
in (c), the etching layer is etched by:
(c-1) altering an exposed region of the etching layer into a region containing ammonium fluorosilicate; and
(c-2) removing the altered region by heating the substrate with the at least one heater.

19. An apparatus for substrate processing comprising:
at least one chamber including a first chamber;
a first gas supply coupled to the first chamber;
a second gas supply coupled to the first chamber; and
a controller configured to cause:
(a) disposing a substrate in the first chamber, the substrate having an etching layer and a patterned layer directly on the etching layer; and
(b) forming an organic film layer on the patterned layer and an exposed surface of the etching layer by:
(b-1) supplying a first organic compound from the first gas supply to the substrate;
(b-2) supplying a second organic compound from the second gas supply to the substrate, the second organic compound being different from the first organic compound;
(b-3) alternately repeating (b-1) and (b-2); and (b-2),
(c) etching the etching layer,
wherein steps (b) and (c) are performed in different chambers,
wherein the organic film layer is formed by polymerization of the first organic compound and the second organic compound on the substrate, and
in (b-1), the first organic compound supplied to the substrate is isocyanate, carboxylic acid, carboxylic halide, or carboxylic anhydride,
wherein the apparatus further comprises at least one heater,
wherein the controller is configured to maintain the substrate on the substrate support at a predetermined temperature with the at least one heater during (b), and
wherein:
in (c), the etching layer is etched by:
(c-1) altering an exposed region of the etching layer into a region containing ammonium fluorosilicate; and
(c-2) removing the altered region by heating the substrate with the at least one heater.

20. The apparatus according to claim 1, wherein: the at least one heater is disposed at a sidewall of the at least one chamber.

21. The apparatus according to claim 1, wherein:
the controller is further configured to cause:
during (b), repeating (b-1), (b-2), and (b-3).

22. The apparatus according to claim 18, wherein:
the controller is further configured to cause:
during (b), repeating (b-1), (b-2), and (b-3) a preset number of times, a thickness of the organic film being determined by the preset number of times.

* * * * *